(12) United States Patent
Jones

(10) Patent No.: US 8,218,644 B1
(45) Date of Patent: Jul. 10, 2012

(54) SYSTEM FOR COMPRESSING AND DE-COMPRESSING DATA USED IN VIDEO PROCESSING

(75) Inventor: Anthony Mark Jones, Beaverton, OR (US)

(73) Assignee: Accumulus Technologies Inc., Portland, OR (US)

( * ) Notice: Subject to any disclaimer, the term of this patent is extended or adjusted under 35 U.S.C. 154(b) by 290 days.

(21) Appl. No.: 12/778,996

(22) Filed: May 12, 2010

Related U.S. Application Data

(60) Provisional application No. 61/177,351, filed on May 12, 2009.

(51) Int. Cl.
*H04N 11/02* (2006.01)
*H03M 7/00* (2006.01)
*H03M 7/34* (2006.01)
*H03M 5/00* (2006.01)

(52) U.S. Cl. ........... 375/240.16; 375/240.1; 375/240.26; 341/50; 341/60; 341/51; 341/55

(58) Field of Classification Search ............... 375/240.1, 375/240.16
See application file for complete search history.

(56) References Cited

U.S. PATENT DOCUMENTS

| | | | |
|---|---|---|---|
| 5,960,193 A * | 9/1999 | Guttag et al. ................ | 712/221 |
| 6,175,593 B1 | 1/2001 | Kim et al. | |
| 6,553,079 B1 * | 4/2003 | Piirainen ...................... | 375/269 |
| 2002/0039386 A1 * | 4/2002 | Han et al. .................. | 375/240.16 |
| 2003/0021344 A1 | 1/2003 | Panusopone et al. | |
| 2004/0126027 A1 * | 7/2004 | Park et al. ..................... | 382/239 |
| 2005/0018772 A1 * | 1/2005 | Sung et al. ................ | 375/240.16 |
| 2005/0031034 A1 | 2/2005 | Kamaci et al. | |
| 2005/0100229 A1 | 5/2005 | Becker et al. | |
| 2005/0135481 A1 | 6/2005 | Sung | |
| 2006/0120613 A1 | 6/2006 | Su et al. | |
| 2006/0133506 A1 | 6/2006 | Dang | |
| 2006/0193388 A1 | 8/2006 | Woods et al. | |
| 2007/0064793 A1 | 3/2007 | Wang et al. | |
| 2007/0064794 A1 | 3/2007 | Wang et al. | |
| 2007/0076802 A1 | 4/2007 | Osamoto et al. | |
| 2007/0121728 A1 | 5/2007 | Wang et al. | |
| 2008/0002770 A1 * | 1/2008 | Ugur et al. ................ | 375/240.16 |
| 2008/0095237 A1 | 4/2008 | Hussain et al. | |
| 2008/0126278 A1 | 5/2008 | Bronstein et al. | |
| 2008/0175322 A1 | 7/2008 | Lee et al. | |
| 2009/0022220 A1 | 1/2009 | Vatis et al. | |
| 2009/0110060 A1 * | 4/2009 | Cortes et al. .............. | 375/240.02 |
| 2010/0150232 A1 * | 6/2010 | Nguyen et al. ........... | 375/240.12 |
| 2010/0201870 A1 * | 8/2010 | Luessi et al. ................. | 348/452 |

* cited by examiner

*Primary Examiner* — David Czekaj
*Assistant Examiner* — Leron Beck
(74) *Attorney, Agent, or Firm* — Marger Johnson & McCollom PC

(57) ABSTRACT

Disclosed are systems and methods used in motion estimation and particularly for data compression. Embodiments of the invention may store and operate on an n-bit value in less than n bits. In one embodiment, if the multi-bit value is less than a threshold, then the multi-bit value is stored in the reduced-bit storage directly, with no loss of precision. If the multi-bit value is greater than the threshold, then the Most Significant Bits (MSBs) of the multi-bit value are shifted into the reduced-bit storage, and a compression flag set. To decompress, if the compression flag was not set, the bits stored in the reduced-bit storage are merely copied back into the multi-bit value directly. If the compression flag was set, then the bits stored in the reduced-bit storage are shifted (left) by the same amount they were shifted (right) during compression, and an error-minimizing value is added.

9 Claims, 37 Drawing Sheets

Intermediate Total Dependencies 6-bit sliding compression

Adding Four Sliding Values

Adapting Carry-In

Counting the Zeroes

Interger SAD Using Absolute Value

Interger SAD Using Intermediate Term

Interger SAD Minimum Term

Counting the Zeroes

Interger 2x2 SAD Using Sliding Arithmetic

4x4 SAD Using Sliding Arithmetic

Fractional Array i-SAD Exact i-Edge Exact r-SAD Exact

Sign-Extended 8-bit Adder r-Edge Exact

2x2 i-SAD Sliding i-Edge Sliding

4x4 i-SAD Using Sliding Arithmetic

Carry Compression

2x2 r-SAD Sliding r-Edge Sliding

4x4 r-SAD Using Sliding Arithmetic

5x5 Search Area

Basic Architecture for H.264 Final Search

Samples For an 4x4 Block Search in a 5x5 Window

Two Example Comparison Sets

Sequential Combine Block

Minimize 25 Values

Unique ID For 25 Values

Computing The Rate Distance Function

Two-Way Selector

Minimum Of Two Values

Sort Four Values

Pipeline Sort Four Values

Replacing One Value In A Sorted Four-List

Inserting Three Values

Pipeline Insert Three Values

Insert Four-List Into Four-List

Pipeline Insert Four-List Into Four-List

Sequential Insert Four-List Into Four-List

Merge Two Four-Lists

Generating a Sorted List Of Length 8

Minimum 4 Of 16 Values

Pre-Sorting Minima Of 16

Basic Comparison Cell

8-Bit Hierarchical Comparison

4-Bit Greater Than

4-Bit Less Than

4-Bit Greater Than Or Equal

4-Bit Less Than Or Equal

8-Bit Less Than

11-Bit Less Than

Clockwise Spiral-Search

Scan-Line Strides

4-Bit Signed-Magnitude Subtract

Re-coded X-Coordinates In Sign-Magnitude

Local Minima Comparison Logic

12-Bit Multiply By 1 or -1

12-Bit Modulus

Unsigned/Signed Add

Signed Comparison

Global Minima Comparison Logic

SYSTEM FOR COMPRESSING AND DE-COMPRESSING DATA USED IN VIDEO PROCESSING

CROSS-REFERENCE TO RELATED APPLICATIONS

This application claims priority from U.S. provisional application 61/177,351, filed May 12, 2009, entitled "System for Creating Sum of Absolute Totals," and is related to U.S. provisional application 61/177,357, filed May 12, 2009, entitled "System for Programmable Rate Distortion;" and U.S. provisional application 61/177,361, filed May 12, 2009, entitled "Deserialized System for Computing Motion Vectors," which are incorporated by reference. This application is also related to U.S. application Ser. No. 12/778,971, filed May 12, 2010, entitled "System for Generating Difference Measurements in a Video Processor"; U.S. application Ser. No. 12/778,980, filed May 12, 2010, entitled "System for Providing Plural Vector Candidates in a Video System"; U.S. application Ser. No. 12/778,990, filed May 12, 2010, entitled "System for Generating Controllable Difference Measurements in a Video Processor"; U.S. application Ser. No. 12/779,000, filed May 12, 2010, entitled "System for Sorting"; U.S. application Ser. No. 12/779,005, filed May 12, 2010, entitled "System for Programmable Rate Distortion"; and U.S. application Ser. No. 12/779,009, filed May 12, 2010, entitled "Deserialized System for Computing Motion Vectors".

TECHNICAL FIELD

This disclosure relates to video compression, and, more particularly, to novel techniques for performing motion estimation.

BACKGROUND

The amount of data in digital video is immense. For example, each frame of a progressive scan 1080p HD video has 2,073,600 pixels (1080×1920), and each frame is typically refreshed 60 times per second. If each pixel takes 3 bytes to represent the full color value, this is 2,986 Mbit/s, it is apparent, then, that video data must be compressed to be handled efficiently.

Although the amount of video data is massive, there are two forms of redundancy that can be exploited. Firstly, in each picture most of video is a mere repetition of what is already on the screen. Secondly, even in fast-moving scenes, little of the screen changes and most of a screen is reproduced in the next frame, although the data may be shifted or located at another point on the screen. Further helping compression is the fact that the human eye acts as a filter, and for example is very insensitive to high frequencies and color. All of these factors allow video to be compressed dramatically while maintaining, at least to the human eye, a good visual quality.

The most compute-intensive portions of a video compression system, or encoder, is motion estimation. Motion estimation exploits the redundancy between frames by searching adjacent frames for similar areas of picture. Instead of sending the original pixel data, it is much more efficient to send a motion vector indicating where the similar area is and a block of (hopefully zero) differences. Each frame is tiled into groups of 16×16 pixels called macroblocks. The macroblock in modern compression systems such as H.264 can have sub-tiles, and each block or sub-block partition in an inter-coded macroblock can have a motion vector. To further compress the vector information, it is assumed that the motion vectors themselves are correlated, as for example in a camera pan. Thus a motion vector of a partition in a current frame can be predicted from its neighbors; it is the difference (often zero) between the prediction and the actual vector that is sent. In the H.264 standard, also known as the International Telecommunication Union-Telecommunications (ITU-T) H.264 standard or ISO/IEC 14496-10, which is incorporated by reference herein, the offset between two motion vectors has a quarter-pixel resolution. This resolution allows natural motions to be determined, which increases the probability of a good match and hence coding efficiency, but comes at the expense of having to match 16× the candidates during a search (compared to integer-resolution) to compute the motion vectors.

The tradeoff in computation resources required to calculate motion vectors is between computation speed and computation area. A large amount of resources may calculate motion vectors quickly, even in real time, but comes at an enormous hardware cost typically reserved for very expensive video delivery systems. At the other end of the spectrum are software systems that are inefficient, yet effective if performance speed is not the primary consideration. Some systems may calculate motion vectors for days to produce just a few minutes of compressed video, which is obviously not time efficient, but in some cases, such as for authoring video before distribution, is acceptable.

Embodiments of the invention address these and other limitations in the prior art.

DETAILED DESCRIPTION OF THE EMBODIMENTS

Figure 1:
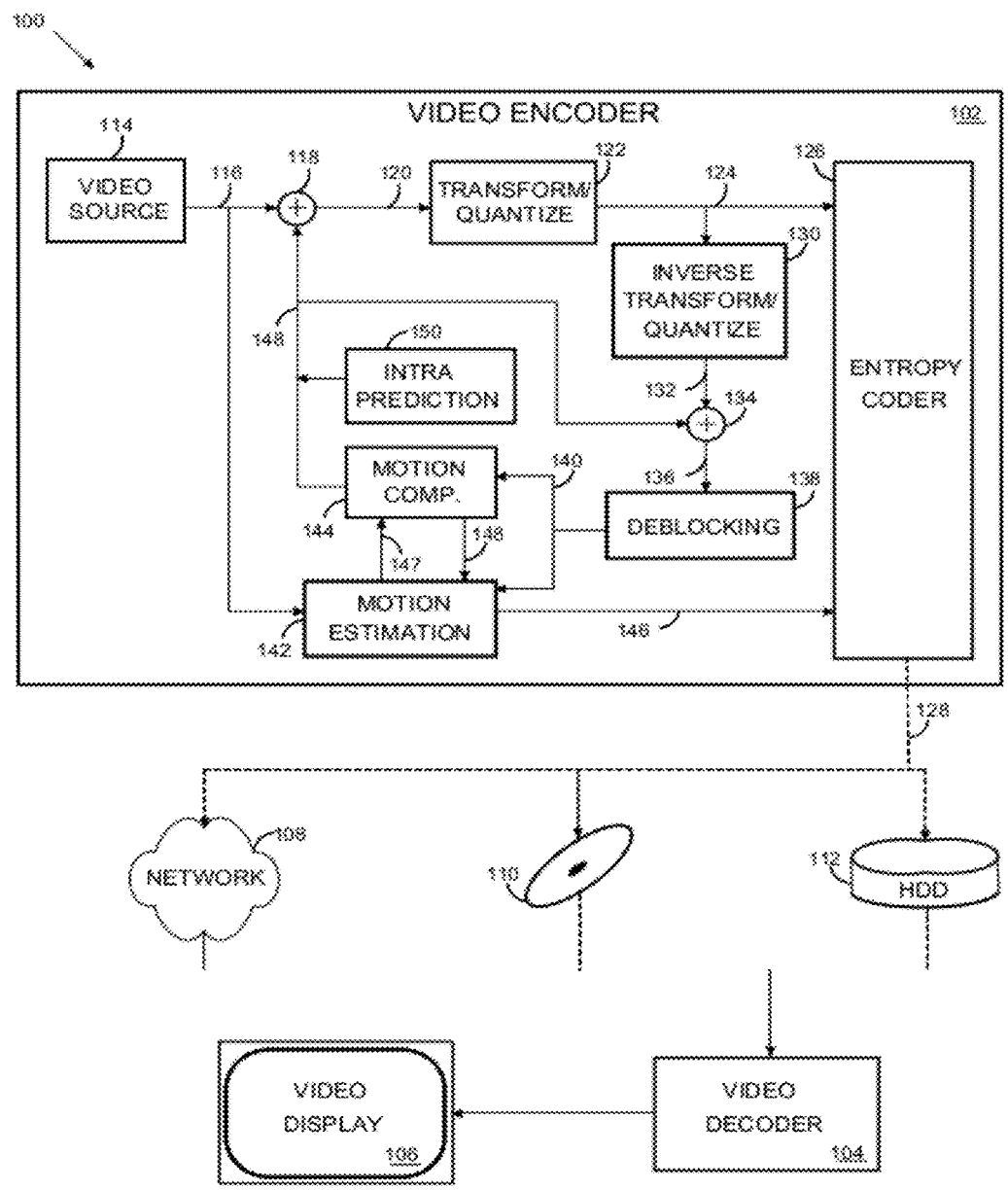
FIG. 1 is a block diagram illustrating a video system including a video encoder, a transmission means, and a video decoder according to embodiments of the invention.

FIG. 1 illustrates an example video system 100, which includes a video encoder 102, a video decoder 104, and a display device 106. The video encoder may be, for example, one that comports with the H.264 standard. The video encoder 102 represents any suitable apparatus, system, or mechanism for producing or otherwise providing compressed video information. For example, the video encoder 102 could represent a streaming-video transmitter capable of transmitting streaming video to a video decoder 104 over a data network 108, such as the Internet, a digital subscriber line (DSL), a wireless network, a direct broadcast satellite (DBS) system, multimedia services over packet networks (MSPN), and a cable television (CATV) network. The video encoder 102 could also represent a digital versatile disc (DVD) burner or other optical disc burner capable of storing compressed video information on a DVD or other optical disc 110. The video encoder 102 could further represent a digital video recorder capable of compressing video information for storage on a hard disk drive (HDD) 112. The video encoder 102 includes any hardware, software, firmware, or combination thereof for compressing video information.

The video decoder 104 decompresses the compressed video information provided by the video encoder 102. The video decoder 104 represents any suitable apparatus, system, or mechanism for decompressing video information. For example, the video decoder 104 could represent a streaming-video receiver capable of receiving streaming video from the video encoder 102 over a network 108. The video decoder 104 could also represent a DVD player or other optical disc player capable of retrieving compressed video information from an optical disc 110. The video decoder 104 could further represent a digital video recorder capable of decompressing video information stored on a hard disk drive 112. The video decoder 104 includes any hardware, software, firmware, or combination thereof for decompressing video information.

In the illustrated example, the video decoder 104 decompresses the previously compressed video information and provides the decompressed video information to a display device 106 for presentation to a viewer. The display device 106 represents any suitable device, system, or structure for presenting video information to one or more viewers. The display device 106 could, for example, represent a television, computer monitor, or projector. The video decoder 104 could provide the decompressed video information to any other or additional destination(s), such as a video cassette player (VCR), digital video recorder (DVR) or other recording device.

In the illustrated embodiment, the video encoder 102 includes a video source 114. The video source 114 provides a video information signal 116 containing video samples to be compressed by the video encoder 102. The video source 114 represents any device, system, or structure capable of generating or otherwise providing uncompressed video information. The video source 114 could, for example, include a television receiver, a VCR, a video camera, a storage device capable of storing raw video data, or any other suitable source of video information. While FIG. 1 illustrates the video source 114 as forming part of the video encoder 102, the video source 114 could also reside outside of the video encoder 102.

A combiner 118 is coupled to the video source 114. In this document, the term "couple" and its derivatives refer to any direct or indirect communication between two or more elements, whether or not those elements are in physical contact with one another. The combiner 118 receives the video information signal 116 containing uncompressed video information from the video source 114. The combiner 118 also receives a feedback video signal 148 from other components in the video encoder 102. The feedback video signal 148 is associated with video information that has already been compressed by the video encoder 102. The combiner 118 identifies any differences between the video information signal 116 and the feedback video signal 148. The combiner 118 then outputs the identified differences as a residual signal 120. The combiner 118 represents any hardware, software, firmware, or combination thereof for combining signals, such as a subtractor.

The residual signal 120 is provided to a transform/quantize unit 122. The transform/quantize unit 122 implements various functions to process the residual signal 120. For example, the transform/quantize unit 122 may implement a transform function to convert the residual signal 120 (in the spatial domain) into discrete cosine transform (DCT) coefficients (in the frequency domain). The transform/quantize unit 122 may also quantize the DCT coefficients and output quantized DCT coefficients 124. In many video compression systems, quantization both reduces the number of bits sent, but can also zero out many of the DCT coefficients such as the high frequency terms the human eye cannot easily perceive. In some embodiments, the transform/quantize unit 122 operates on blocks of pixels from images being compressed (such as 16×16 macroblocks) and produces blocks of quantized DCT coefficients 124. The transform/quantize unit 122 includes any hardware, software, firmware, or combination thereof for transforming and quantizing video information.

The quantized DCT coefficients 124 are provided to an entropy encoder 126. The entropy encoder 126 encodes the quantized DCT coefficients 124 (along with other information) to produce compressed video information 128. The entropy encoder 126 may implement any suitable encoding technique, such as context adaptive based arithmetic coding (CABAC), context adaptive variable length coding (CAVLC) or Huffman coding. The entropy encoder 126 includes any hardware, software, firmware, or combination thereof for encoding quantized DCT coefficients 124 and other information.

The quantized DCT coefficients 124 are provided to an inverse transform/quantize unit 130. The inverse transform/quantize unit 130 processes the quantized DCT coefficients 124 and mathematically reverse the processing performed by the transform/quantize unit 122. For example, the inverse transform/quantize unit 130 could implement an inverse quantization function to produce DCT coefficients. The inverse transform/quantize unit 130 could also implement an inverse-DCT transform to produce a reconstructed residual signal 132. The reconstructed residual signal 132 might match the original residual signal 120, or the reconstructed residual signal 132 may be similar to the residual signal 120 but have some small differences. The inverse transform/quantize unit 130 includes any hardware, software, firmware, or combination thereof for performing inverse transform and inverse quantization functions.

The reconstructed residual signal 132 is provided to a combiner 134. The combiner 134 also receives the feedback video signal 148. The combiner 134 then combines the reconstructed residual signal 132 and the feedback video signal 148 to produce a combined signal 136. The combiner 134 represents any hardware, software, firmware, or combination thereof for combining signals, such as an adder.

The combined signal 136 is provided to a deblocking filter 138. The deblocking filter 138 reduces blocking artifacts in images being decompressed, such as blocking artifacts located along the boundaries of different 4×4 pixel blocks. This produces filtered video information 140. The deblocking filter 138 represents any hardware, software, firmware, or combination thereof for reducing blocking artifacts.

The filtered video information 140 is provided to a motion estimator 142 and a motion compensator 144. The motion estimator 142 also receives the original video information signal 116 and the feedback video signal 148. The motion estimator 142 uses the received information to search for and identify motion within video images being compressed, as described in detail below. The motion estimator 142 outputs motion vectors 146, which represent the identified motion in the images. The motion vectors 146 are also provided to the entropy encoder 126 for coding as part of the compressed video information 128, and to the motion compensator 144 as well. The motion estimator 142 includes any hardware, software, firmware, or combination thereof for estimating motion in video images, as is described below.

The motion compensator 144 receives the filtered video information 140 and the motion vectors 146. The motion compensator 144 uses the motion vectors 146 to fetch the appropriate block of pixels from the filtered video information 140 and add the residual information into the filtered video information 140. This produces the feedback video signal 148, which may or may not exactly match the original video information signal 116. The motion compensator 144 includes any hardware, software, firmware, or combination thereof for altering video information to introduce motion into video images.

In the illustrated example, an intra prediction unit 150 is used to process the video information when an intra prediction mode is used. Intra prediction utilizes the video data redundancy within a frame. The intra prediction mode is defined in the H.264 standard and analyzes 16×16 macroblocks within a single frame in 4×4 blocks or partitions. In some embodiments, when intra prediction mode is used, the transform/quantize unit 122 implements the intra prediction mechanism on the 4×4 partitions. The intra prediction unit 150 implements a reverse of this process and generates the feedback video signal 148 when the video encoder 102 operates in the intra prediction mode.

The video decoder 104 could include many similar components as the video encoder 102 shown in FIG. 1. For example, the video decoder 104 could include the inverse transform/quantize unit 130, the combiner 134, the deblocking filter 138, the motion compensator 144, and the intra prediction unit 150. The video decoder 104 could also include an inverse entropy coder that implements the inverse of the coding function used by the entropy coder 126. The inverse entropy coder could receive the compressed video information 128, provide quantized DCT coefficients 124 to the inverse transform/quantize unit 130, and provide motion vectors 146 to the motion compensator 144. In this way, the video decoder 104 decompresses the video information 128 and recovers the video information signal 116 for presentation to a viewer.

In particular embodiments, the video encoder 102 and the video decoder 104 implement the H.264 compression scheme. The H.264 compression scheme supports several advanced video coding techniques, such as directional spatial prediction, multi-frame references, weighted prediction, de-blocking filtering, variable block size, and quarter-sample accurate motion compensations. The H.264 compression scheme also supports a small, block-based, integer, and hierarchical transform, as well as CABAC and CAVLC coding.

Although FIG. 1 illustrates one example of a video system 100, various changes may be made to FIG. 1. For example, FIG. 1 illustrates that compressed video information may be supplied to a video decoder 104 over a network 108, using an optical disc 110, or on a hard disk drive 112. The video encoder 102 could place the compressed video information on any other suitable storage medium or otherwise communicate the information to the video decoder 104 in any suitable manner. Also, FIG. 1 illustrates one example embodiment of the video encoder 102. Other embodiments of the video encoder 102 may be used, for example components of FIG. 1 may be discarded to implement an MPEG-2 encoder. In addition, the video encoder 102 and the video decoder 104 could be combined into a single device or apparatus.

The Sum of Absolute Differences, or SAD, is a basic comparison measure used to compare two lists of numbers. Each list member is compared against the corresponding value in the other list by subtracting the corresponding values; if the subtraction is negative, it is made positive by multiplying by −1, to give the absolute value of the difference is computed. Finally all the absolute differences are added together to give the final measure. A value of zero indicates that the two lists are identical, while a value near zero indicates a close match. A large SAD value indicates a poor match.

Figure 2:
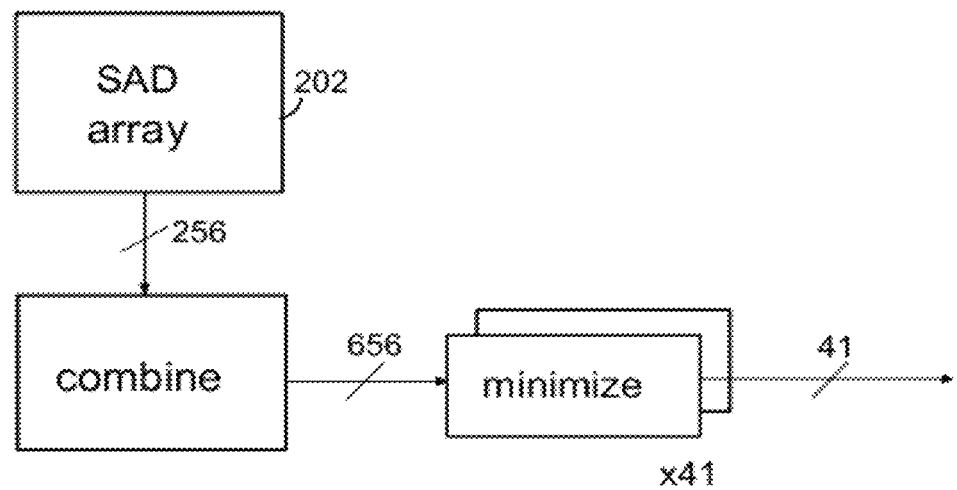
FIG. 2 is a block diagram of a conventional integer search core component part of a motion estimation block of an encoder.

SAD calculations are very commonly used to compare blocks of pixels in video circuits. FIG. 2 is a conventional integer search core 200 within a motion estimation block 142 of FIG. 1. In FIG. 2, a SAD array 202 uses 16 adjacent 4×4 reference blocks of a single 16×16 macroblock and a 19×19 candidate array of pixels. In operation, the SAD array 202 computes a SAD value for each of the 16 4×4 blocks at 16 vector offsets: (0,0), (1,0), (2,0), (3,0), (0,1), (1,1), (2,1), (3,1), (0,2), (1,2), (2,2), (3,2), (0,3), (1,3), (2,3), (3,3). The SAD array therefore computes 256 SAD values, with each SAD value being the sum of 16 differences (a 4×4 block). Next, the individual 4×4 values are combined based on the 41 legal macroblock sub-partition tilings defined in the H.264 standard, which include:

4×4-16 sub-partitions
4×8-8 sub-partitions
8×4-8 sub-partitions
8×8-4 sub-partitions
16×8-2 sub-partitions
8×16-2 sub-partitions
16×16-1 sub-partition After being combined, a minimal SAD value is determined separately for each of the 41 sub-partitions to generate the final output of 41 minimum SAD values.

Figure 3:
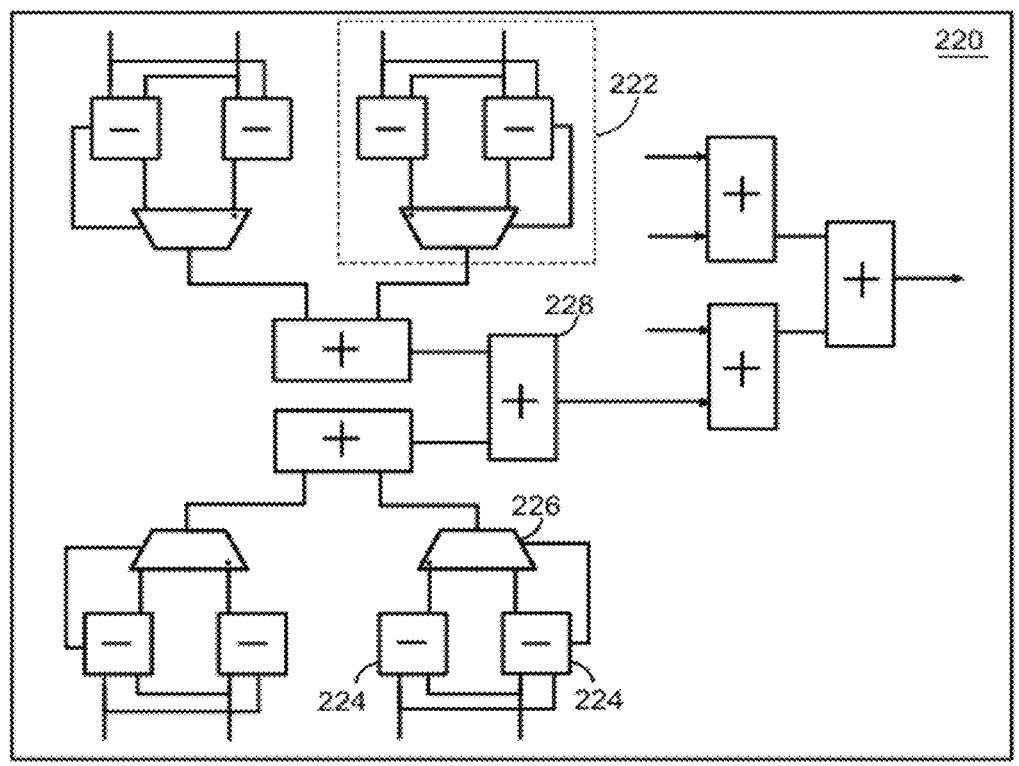
FIG. 3 is a schematic diagram of a conventional SAD circuit.

FIG. 3 shows a conventional SAD calculating circuit 220 that takes 16 pixel values as input from a 4×4 block. One quarter of the calculating circuit 220 is illustrated in detail as portion 222. The calculating circuit portion 222 includes eight subtractors 224, four multiplexers 226, and three adders 228. The multiplexer 226 is coupled to the output of one of the subtractors 224, and is used to select the positive result based on a "overflow" bit output of the subtractor 224. For instance, if two inputs to one pair of subtractors 224 are "5" and "3," the output of both of the subtractors 224 will be "2," but one of the overflow bits will be set to "1" while the other will remain "0." The positive output is the one with the "0" overflow bit (typically denoted the sign-bit), so the multiplexer 226 selects the positive value (that with the "0" sign-bit) to be added in the adder 228. Eventually, after all of the adders in the SAD calculating circuit 220 have been added together, a single output from the circuit 220 holds the sum of the absolute differences for the entire set of 16 input pixel values.

Figure 4:
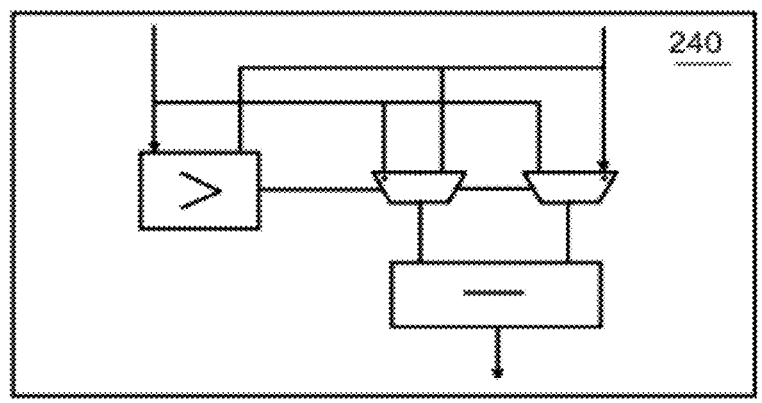
FIG. 4 is an alternative absolute difference circuit according to embodiments of the invention.

Another conventional alternative SAD sub-circuit 240 is illustrated as FIG. 4. In this sub-circuit a "greater than" operation on positive inputs can be computed in significantly less gates than using a full subtractor, such as illustrated in FIG. 3. Therefore, SAD circuitry made from an array of sub-circuits 240 of FIG. 4 can be made smaller than the corresponding SAD calculating circuit 220 of FIG. 3.

Embodiments of the invention use new decompositions of absolute difference to further reduce the number of gates required, and to allow the use of approximating arithmetic, if desired.

The first new decomposition is given by:

$$|a-b| = a+b-2\min(a,b) \quad \text{Equation (1)}$$

The advantages of Equation 1 will be seen below, but one of the main concepts is that the "absolute" operation has been removed and each three of the terms on the Right Hand Side (RHS) can be treated independently.

The second new decomposition is given by:

$$|a-b| = a-b+2\begin{cases} 0 & b-a < 0 \\ b-a \end{cases} \quad \text{Equation (2)}$$

Equation (2) also allows all the terms on the RHS to be treated independently, but has an advantage over Equation 1 in that the right-most "correction term" is small when the difference is small and is large when the difference is large. This observation has real-world applications as described below.

Figure 5:
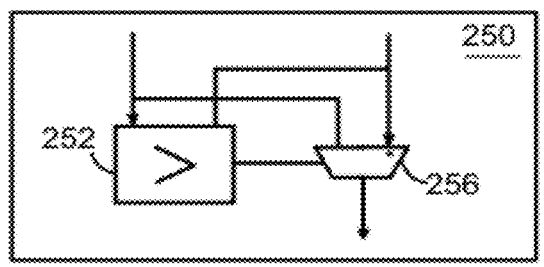
FIG. 5 is a minimum function circuit according to embodiments of the invention.

To compute the minimum function used by Equation 2, a minimizing circuit 250 is used, as illustrated in FIG. 5. The minimizing circuit 250 takes advantage of the "greater than" function 256, described above, has only one multiplexer 256, and does not include any subtractor, unlike the sub-circuit 240 of FIG. 4.

A correction term to Equation 2 can be defined as follows:

$$c = \begin{cases} 0 & b-a < 0 \\ b-a \end{cases} \quad \text{Equation (3)}$$

Figure 6:
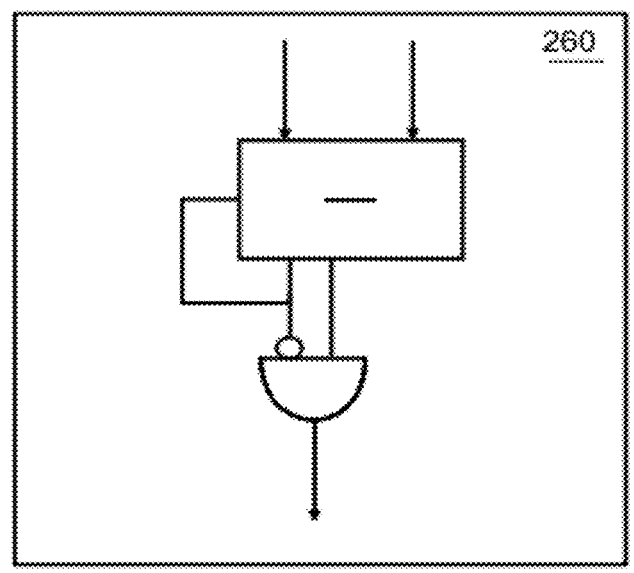
FIG. 6 is a correction term circuit according to embodiments of the invention.

To compute the correction term given by Equation 3, a correction circuit 260 illustrated in FIG. 6 may be used. Compared to the traditional SAD calculating circuit 230 of FIG. 3, there is only one subtraction and no multiplexer.

Armed with these new decompositions, the SAD can be redefined and computed more efficiently. The first new SAD equation is given by:

$$SAD = \sum_i a_i + \sum_i b_i + 2\sum_i \min(a_i, b_i) \quad \text{Equation (4)}$$

In a typical system where a reference object list $a_i$ is being compared to a number of different candidate object lists $b_i$, there are several advantages of Equation 4, such as: a) the summation of $a_i$ term is a constant for all comparisons and can be pre-computed; b) the summation of $b_i$ term is a "sliding" constant, which is easily re-used in subsequent comparisons, and can be cheaply computed, in terms of computing resources, outside the main SAD loop; and c) the final "correction term" is simply the minimum circuit of FIG. 5

The second new SAD equation is given by:

$$SAD = \sum_i a_i - \sum_i b_i + 2\sum_i c_i \quad \text{Equation (5)}$$

where each $c_i$ is computed using Equation 3. The advantages of Equation 5 are similar to Equation 4, with the difference being that each of the $c_i$ is small if the final SAD measure is small, and at least one of the $c_i$ will be large if the final SAD value is large. This can be used to decrease the hardware further by clipping large values of $c_i$. The advantages from Equation 4 remain: a) the summation of $a_i$ term is a constant for all comparisons and can be pre-computed; b) the summation of $b_i$ term is a "sliding" constant, which can easily be re-used in subsequent comparisons, and can be cheaply computed, in terms of computing resources, outside the main SAD loop; and c) the summation of $c_i$ term is simply the correction term circuit 260 of FIG. 6

Integer and Fractional Samples

In video systems, the lists used for computing SADs are rectangular matrices of pixel values. Each matrix is called a pixel block and can vary in size from 4×4 to 16×16. To estimate motion, each frame is first tiled into a number of pixel blocks. Each reference pixel block is then searched in subsequent frames against similar-sized pixel blocks, offset by a vector from the original block position.

Figure 7:
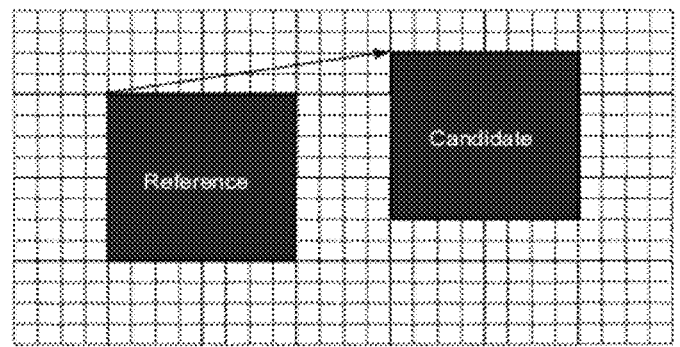
FIG. 7 is a block diagram illustrating a conventional block comparison.

In FIG. 7, a conventional example search at an offset of (12,−2) is shown. The 8×8 reference (in general from another frame) is shown in an original position, and the 8×8 candidate shifted by (12,−2) is also illustrated. The comparison is done by using a SAD value computed using a summation of 8×8=64 absolute differences.

To search for motion, a large number of candidates are compared for each reference. If the search area is W by H pixels, then W*H candidates must be compared, with offsets ranging from (0,0) to (W−1,H−1). For example, an HD video frame has 129,600 reference blocks and if the search area is 128×64 pixels, there are over 1 billion SAD values to be computed for each frame.

By definition, if the offsets are all integral (integer) numbers of pixels, the search is an integer pixel search. This means that only motion that is aligned to the integer grid can be discovered. Since motion is unlikely to be on grid, most video systems require that fractional offsets are used in a fractional pixel search. For the common MPEG-2 video compression standard, the offset are multiples of 0.5 and are called half-pixel, or h-pel, offsets. In the more modern H.264 video compression standard, the offsets are multiples of 0.25 and are called quarter-pixel, or q-pel, offsets. The advantages of q-pel searches are that true motions can be better described. The disadvantages are that 16 times as much work needs to be done to specify motion vectors to the q-pel granularity level, as compared to the standard i-pel level, and that the original pixel block, and every candidate block, must be filtered to create the extra samples.

To create the fractional candidates, interpolation is used. An interpolation filter is applied to the original frame's integer pixels to create a pixel that has a fractional offset.

Figure 8:
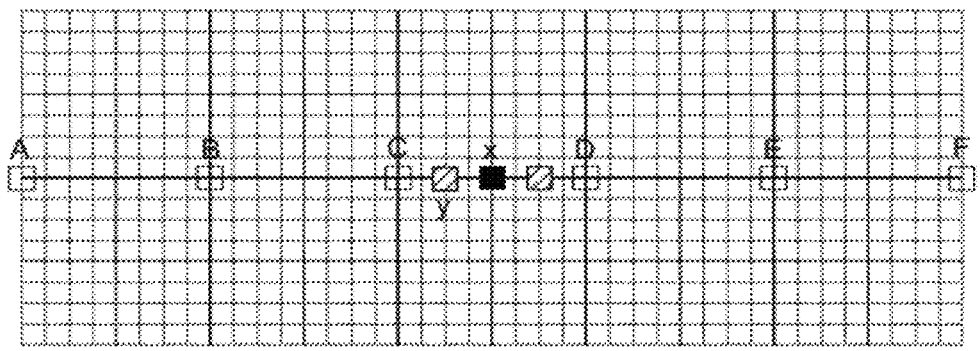
FIG. 8 is a block diagram illustrating how linear h-pel and q-pel values are conventionally interpolated from known values.

FIG. 8 is a block diagram illustrating particular integer pixels A-F along a line of video data. Video data at pixels C and D are known, but values x and y of FIG. 8 must be calculated.

In MPEG-2, the h-pel sample x is given by simple bi-linear interpolation:

$$x = \frac{C+D}{2} \qquad \text{Equation (6)}$$

In H.264, a more complex 6-tap Wiener filter is used for the h-pel sample:

$$x = \frac{A - 5B + 20C + 20D - 5E + F}{32} \qquad \text{Equation (7)}$$

To compute the q-pel samples, simple bi-linear interpolation is then used in H.264:

$$y = \frac{x+C}{2} \qquad \text{Equation (8)}$$

Figure 9:
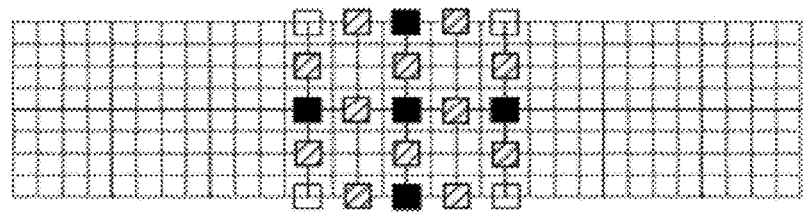
FIG. 9 is a block diagram illustrating how additional desired linear h-pel and q-pel samples are conventionally generated.

The H.264 standard is very particular about the order the bi-linear filter is applied in that the inputs to Equation 8 can only be h-pel or integer-pel values, and not q-pel values. For most of the q-pel samples, this restriction is quite natural, as illustrated in FIG. 9. In that figure, the h-pels can be calculated using Equation (7) above, while the q-pels are calculated using Equation (8).

Figure 10:
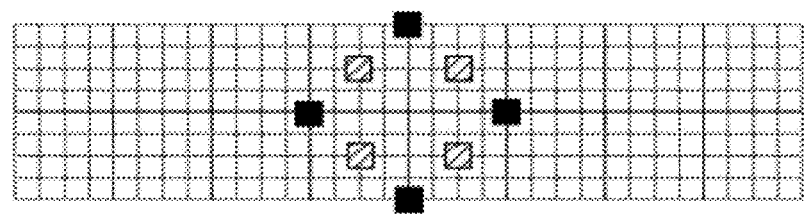
FIG. 10 is a block diagram illustrating how diagonal q-pel samples are generated from neighboring values according to the H.264 standard.

For the remaining four q-pel samples illustrated in FIG. 10, the natural interpolation would be from other neighboring q-pel samples, but H.264 restricts the calculation of these q-pel samples to diagonal interpolation from the four h-pel samples, as illustrated in FIG. 10.

Embodiments of the invention, which also calculate h-pel and q-pel pixel values, uses the H.264 diagonal interpolation, but is not necessarily restricted to that scheme.

To search fractional offsets, traditionally the candidate frame is first filtered to create the new samples, effectively yielding a frame 16 times as large. The new samples are then treated as integer values and fed into a traditional SAD computation—in this case the offsets are treated as integral (integer) values that are really representing 0.25 pixel steps.

Folding the Interpolation Filter

Embodiments of the invention search for the best match, that is a minimum SAD value, using a bi-linear prediction for all fractional samples. Any SAD value difference between the bi-linear filter, and say, the Weiner filter is resolved later in a refinement process. The basic bi-linear SAD equation is given by:

$$SAD = \sum_i \left| a_i - \frac{b_i + c_i}{2} \right| \qquad \text{Equation (9)}$$

where $a_i$ is the reference value and $b_i$ and $c_i$ are adjacent candidate samples and $(b_i+c_i)/2$ is the interpolated value in between pixels $b_i$ and $c_i$.

Sum of Absolute Totals

Embodiments of the invention uses a new technique, the Sum of Absolute Totals, or SAT, to emulate a bi-linear filter with no external filtering. Examples in reference to FIG. 11 are instructive.

Figure 11:
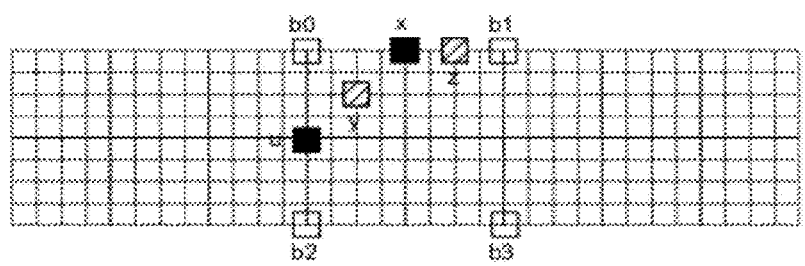
FIG. 11 is a block diagram illustrating how various difference values are generated using embodiments of the invention.

In FIG. 11, b0, b1, b2, and b3 indicate integer values, while u and x indicate h-pels and y and z indicate q-pels. The absolute difference terms for each of the candidate interpolated samples x, y and z with some reference value a are as follows:

$$AD_x = \left| a - \frac{b_0 + b_1}{2} \right| \qquad \text{Equations (10)}$$

$$AD_z = \left| a - \frac{b_0 + 3b_1}{4} \right| \qquad \text{Equation (11)}$$

$$AD_z = \left| a - \frac{2b_0 + b_1 + b_2}{4} \right| \qquad \text{Equation (12)}$$

With some simple algebraic manipulation, Equations 10-12 can be re-written in AT form:

$$AD_x = \frac{1}{2}|(a - b_0) + (a - b_1)| \qquad \text{Equation (13)}$$

$$AD_z = \frac{1}{2}\left|(a - b_1) + \left(\frac{a - b_0}{2} + \frac{a - b_1}{2}\right)\right| \qquad \text{Equation (14)}$$

$$AD_y = \frac{1}{2}\left|\left(\frac{a - b_0}{2} + \frac{a - b_1}{2}\right) + \left(\frac{a - b_0}{2} + \frac{a - b_2}{2}\right)\right| \qquad \text{Equation (15)}$$

A key observation is that the AD computation becomes an absolute total of two terms, each of which is half the total of the adjacent neighbors, thus making the SAT terms defined by an iterative process. To make this clear, step through the stages to compute the samples shown in FIG. 11:

1. Compute the Intermediate Total (IT) for integer position $b_0$ (a−$b_0$) and $b_1$ (a−$b_1$) and $b_2$ (a−$b_2$);
2. Compute the IT for h-pel position x by summing half the IT of position $b_0$ and $b_1$;
3. Compute the IT for h-pel position u by summing half the IT of position $b_0$ and $b_2$;

4. Compute the IT for q-pel position z by summing half the IT of position $b_1$ and x;
5. Compute the IT for q-pel position y by summing half the IT of position x and u.

It is simple to derive from the above discussion that the AD at any position is:

$$AD = |IT| \quad \text{Equation (16)}$$

and the intermediate total IT is given by:

$$IT = \frac{IT_n + IT_m}{2} = \frac{IT_n}{2} + \frac{IT_m}{2} \quad \text{Equation (17)}$$

where $IT_m$ and $IT_n$ are the intermediate totals of the appropriate neighbors. The iteration stops at an integer pixel position, where the intermediate total is simply the difference between the reference value and the candidate value.

Figure 12A:
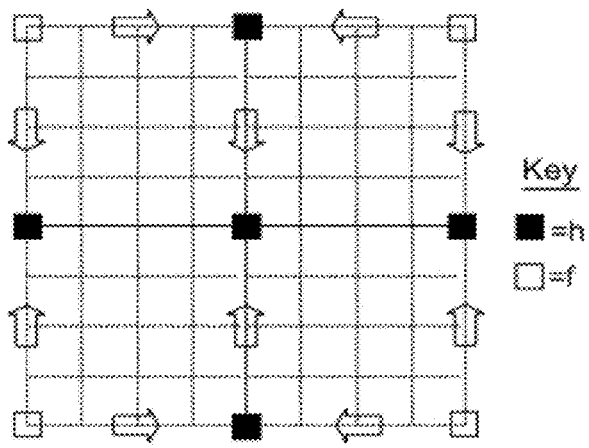
FIG. 12 is a block diagram illustrating how additional difference values are generated using embodiments of the invention.
Figure 12B:
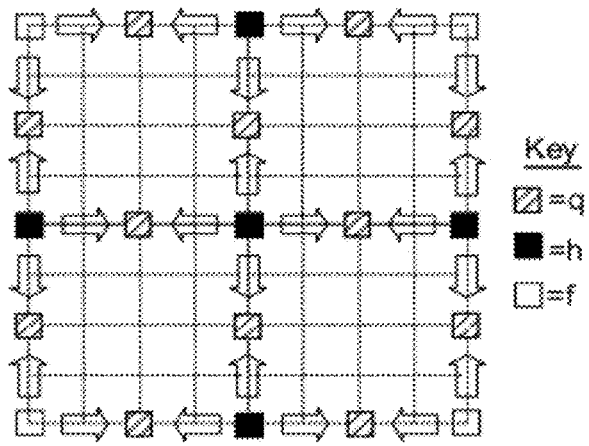
Figure 12C:
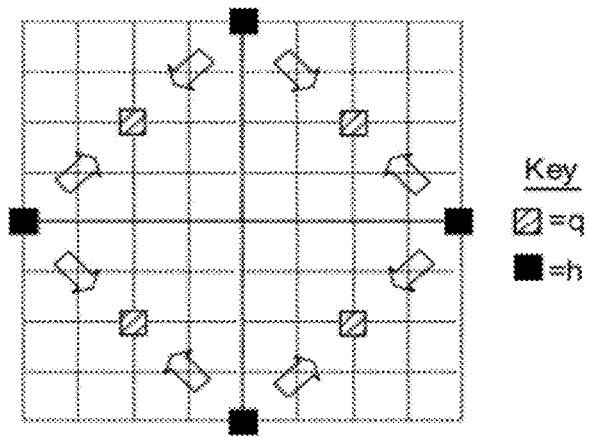

The following views of FIG. 12 show the dependencies, and hence the flow of intermediate total, for all of the samples between the four corner integer pixel samples.

In summary, it has been shown above that the absolute difference of bi-linear interpolation is equivalent to half the absolute total of the intermediate values, which are defined iteratively. Thus the bi-linear interpolated SAD is just the SAT of the intermediate values:

$$SAT = \sum_{i,j} \left| \frac{IT_i}{2} + \frac{IT_j}{2} \right| \quad \text{Equation (18)}$$

and requires no external filter of the integer samples since each of the $IT_i$ and $IT_j$ are computed by the neighbors when the neighbors compute their SAD measure.

Approximating SAT

There are two interesting approaches that can be used to compute the SAT. First, note that the intermediate terms $IT_i$ and $IT_j$ in Equation 18 are signed values. Redefine Equation 18 as:

$$AT = |d+e| \quad \text{Equation (19)}$$

and represent the signed terms d and e in signed magnitude:

$$d = s_d \times \delta$$

$$e = s_e \times \epsilon$$

where δ and ε are positive numbers and $s_d$ and $s_e$ are a single bit value representing −1 or +1. The final definition for both approaches is the different sign bit, γ, which for each position in a list is given by: $\gamma = (s_d \neq s_e)$ First SAT Approximation The first thing to note is that if γ=0 then:

$$AT = |d+e| = |\delta + \epsilon| = |-\delta - \epsilon| = \delta + \epsilon$$

If γ=1 then:

$$AT = |d+e| = |\epsilon - \delta| = |\delta - \epsilon|$$

This then allows the SAT to be defined as follows:

$$SAT = \begin{cases} \sum_i \delta_i + \sum_i \epsilon_i & (\gamma_i = 0) \forall i \\ \sum_i |\delta_i - \epsilon_i| & \end{cases} \quad \text{Equation (20)}$$

The critical observations of Equation 20 are:

$$SAD_m = \sum_i \delta_i$$

$$SAD_n = \sum_i \epsilon_i$$

$$\sum |\delta_i + \epsilon_i| \approx c \left| \sum \delta_i - \sum \epsilon_i \right| = c|SAD_m - SAD_n|$$

where c is a small constant. This allows Equation 20 to be defined purely in terms of the neighbor SAD values, previously computed, and requires no summation loops:

$$SAT \approx \begin{cases} SAD_m + SAD_n & (\gamma_i = 0) \forall i \\ c|SAD_m - SAD_n| & \end{cases}$$

In the interesting case when the final SAT is small, that is a good overall match, each δ and ε are close in value and the approximation is best made with a constant c=2.

Approximate SAT with Correction

In this version, the key observation is if γ=1 then:

$$AT = |d+e| = |\epsilon - \delta| = |\delta - \epsilon|$$

$$AT = |d+e| = |\epsilon - \delta| = |\delta - \epsilon|$$
$$= \delta + \epsilon - 2\min(\delta, \epsilon)$$

So piecing together both cases for γ=0 and γ=1:

$$AT = \delta + \epsilon - 2\gamma \cdot \min(\delta_i, \epsilon_i)$$

This gives the desired result where the SAT is computed from the previous SAD values with a simple to compute correction term involving the AND-function of γ and the minimum of δ and ε:

$$SAT = SAD_m + SAD_n - 2\sum_i \gamma_i \cdot \min(\delta_i, \epsilon_i) \quad \text{Equation (21)}$$

The interesting aspect of Equation 21 is that the summation term is a correction and so can be done with approximate or clipped values of δ and ε.

Sliding Arithmetic

To reduce the amount of logic when summing values, a compressed arithmetic can be used. In embodiments of the invention, a number of SAD values are compared to determine the best match, which is defined by the lowest SAD value. This means that all but one of the values are discarded during the search and any error in the SAD values that are discarded is irrelevant. This leads to the concept of using an arithmetic which is exact for small values, but uses an overestimate when the value is large.

The basic idea is to reduce 8-bit values to a 4-bit value with a additional flag bit. All of the summation arithmetic is done on the 4-bit values to reduce the logic count.

In one embodiment of the invention the following compression scheme is used:

$$\text{Compress equation: } x = \begin{cases} n & n < 16 \\ n/16 \end{cases}$$

The flag bit is denoted by m and is set if the input value has been divided (shifted right). To decompress, a mid-tread scheme is used:

$$\text{Decompress equation: } n = \begin{cases} x & m = 1 \\ 16x + 8 \end{cases}$$

Figure 13:
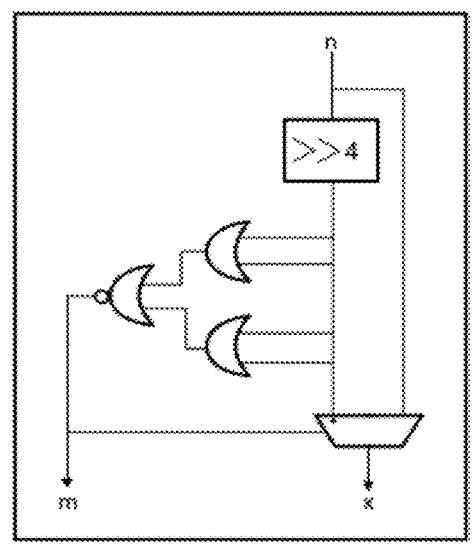
FIG. 13 is a schematic diagram of a sliding compression circuit according to embodiments of the invention.

The compression logic is illustrated in FIG. 13, where, as illustrated in the compress equation above, the 8-bit number n is being compressed. The output x is equal to n when n is less than 16, and x contains the uppermost bits of n shifted by 4 right when n is 16 or greater. Decompression uses the decompress equation, where n=x if the compression was not used, and equals 8+x shifted by 4 left when compression was used. There is some error, of course, when de-compressing large values of n. Choosing the value 8, which is the average of 0 and 16, minimizes the de-compression error when considering large statistical samples such as millions of pixel values. Regardless of the errors, however, is that a good match (low SAD value) must have been computed from small differences in each position, and so there are no errors for good matches.

Figure 14:
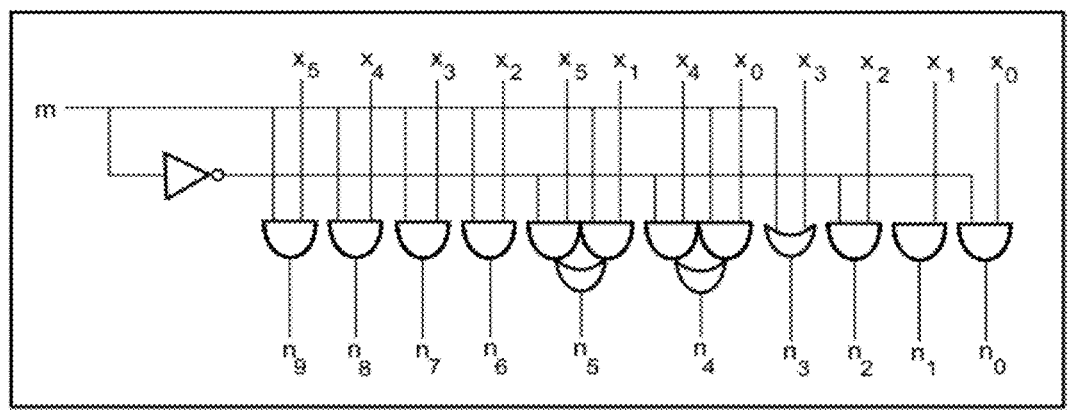
FIG. 14 is a schematic diagram of a sliding compression circuit according to embodiments of the invention that is larger than the circuit illustrated in FIG. 13.

This concept is easily extended to accommodate larger numbers. The decompression logic for a 6-bit sliding number to a 10-bit unsigned number is illustrated in FIG. 14.

Figure 15:
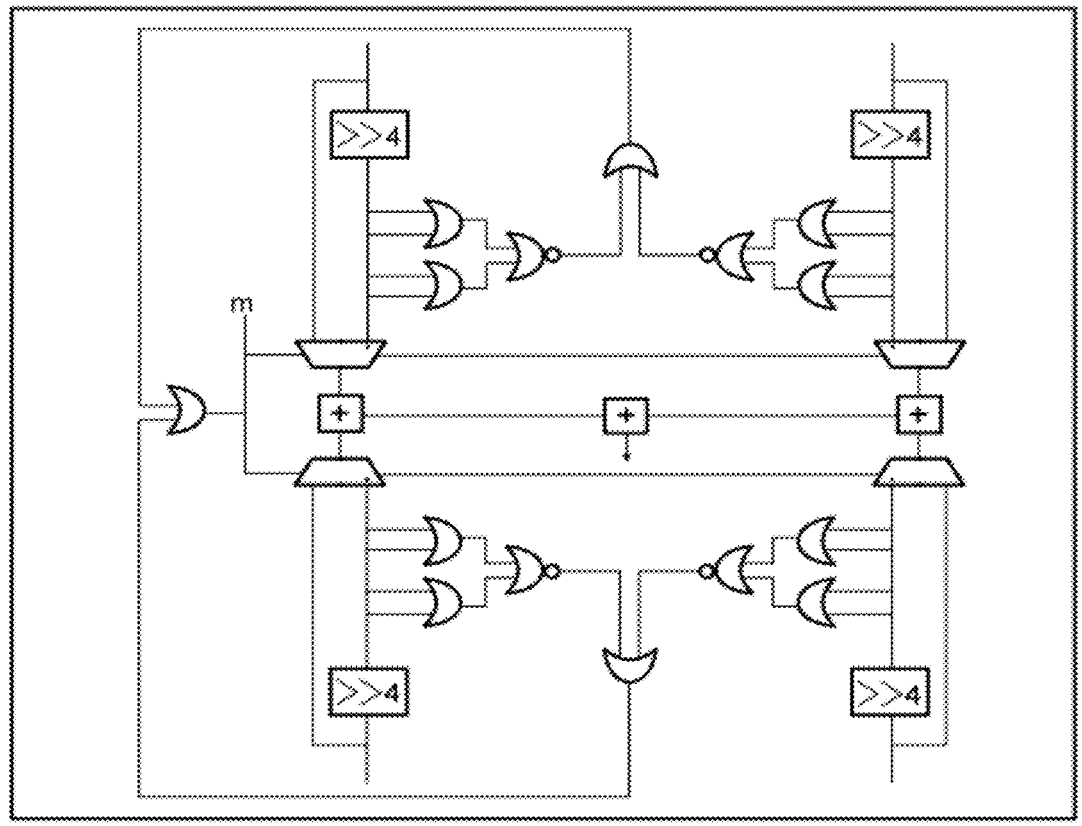
FIG. 15 is a schematic diagram illustrating an adding circuit for values compressed using sliding compression according to embodiments of the invention.

In this embodiment, when four sliding values are added, the m-bit for each is checked and if any one is asserted, then all of the values are compressed so that the numbers being added are in the same scale. FIG. 15 illustrates the scheme in more detail. The adder tree 270 includes two 4-bit adders followed by a single 5-bit adder, yielding a 6-bit result along with an m-bit code that denotes whether the result has "slid," i.e., if any of the values were de-compressed so they could be added in scale. In this embodiment, the fundamental repeated unit is a 4×4 SAD which uses four instances of FIG. 15 followed by three adders to sum the outputs. In this embodiment, the output of FIG. 15 is immediately decompressed into an unsigned 10-bit number before being put into one of the three adders so that the final additions incur no further error.

Rounding

In FIG. 15, the carry-in terms are not shown. There are three cases that are handled:

1. The sliding inputs to the adder tree have m=0
2. The sliding inputs to the adder tree are set to m=1
3. The sliding inputs to the adder tree are set to m=1, but some of them are (known to be) zero In case #1, all the numbers are added in range and the carry-in terms are as if there is no sliding. For case #2, the numbers have been scaled down. This means:

Any absolute value rounding is irrelevant and can be ignored

Figure 16:
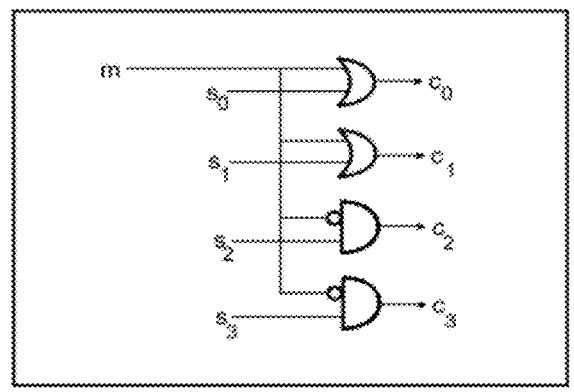
FIG. 16 is a schematic diagram illustrating the carry-in function of the sliding circuit illustrated in FIG. 13.

In effect four 0.5 values are being represented and not being summed, which means there is an extra value of 2 to be added to the tree illustrated in FIG. 16.

For case #3, the numbers have been scaled down, but some of them may be zero. In one embodiment the following scheme is used:

If there are no zeroes, then four 0.5 values are being summed, so add 4*0.5=2

If there is one zero, then add 3*0.5=1

If there are two zeroes, then add 2*0.5=1

If there are three zeroes then add 1*0.5=0

The case of four zeroes does not occur because there would be no sliding.

Figure 17:
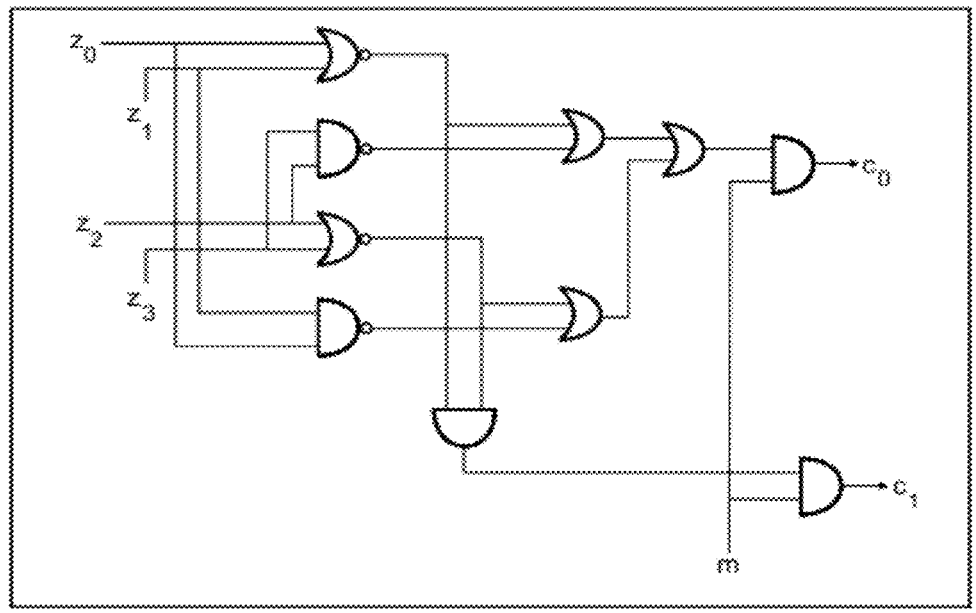
FIG. 17 is a schematic diagram of a zero counting circuit for use with the sliding compression circuit according to embodiments of the invention.

The number of zeros can be counted in a circuit as illustrated in FIG. 17. In that figure the four zero inputs are converted into two carry-in terms to perform the function of case #3. If the zero inputs are being generated, there is no absolute value being computed and so there are no other carry-in terms.

Input Filtering

The effect of using sliding arithmetic adds a filter to the results. For example if we took the following difference lists:

{−18, −1, −1, −1, −1, −1, −1, −1}: SAD=25
{−3,3, −3,3, −4,3, −4,3}: SAD=26

If no sliding arithmetic were used, the first difference list would be preferred. However the sliding arithmetic used in this embodiment "adjusts" the value 18 being it is slid and so over-estimates the SAD. Thus the second list would be chosen because the SAD value would be exact and smaller than the over-estimate skewed by the large difference of −18.

In a real-world system this could be advantageous in three ways:

The entropy is smaller, so a frequency-transformed run-length encoded version would be smaller;

When quantized the second list is more uniform and so less distorted;

The perceived distortion is less when decoded because there is no solitary spike.

Several Core elements may be combined in various ways to make practical and functional machines. A number of implementations of the integer SAD core element are shown and compared. All of these example core elements compute a 4×4 SAD, although the concepts may be used for computation of any array size.

Integer SAD Exact

Figure 18:
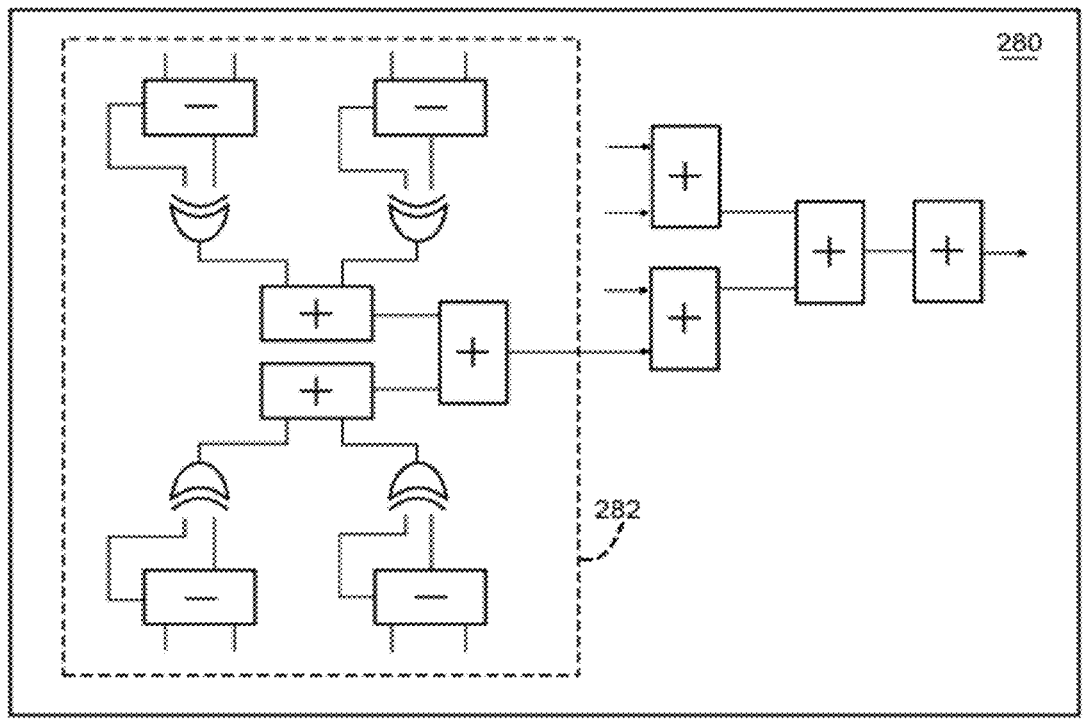
FIG. 18 is a schematic diagram of an integer SAD calculating circuit using absolute value according to embodiments of the invention.
Figure 19:
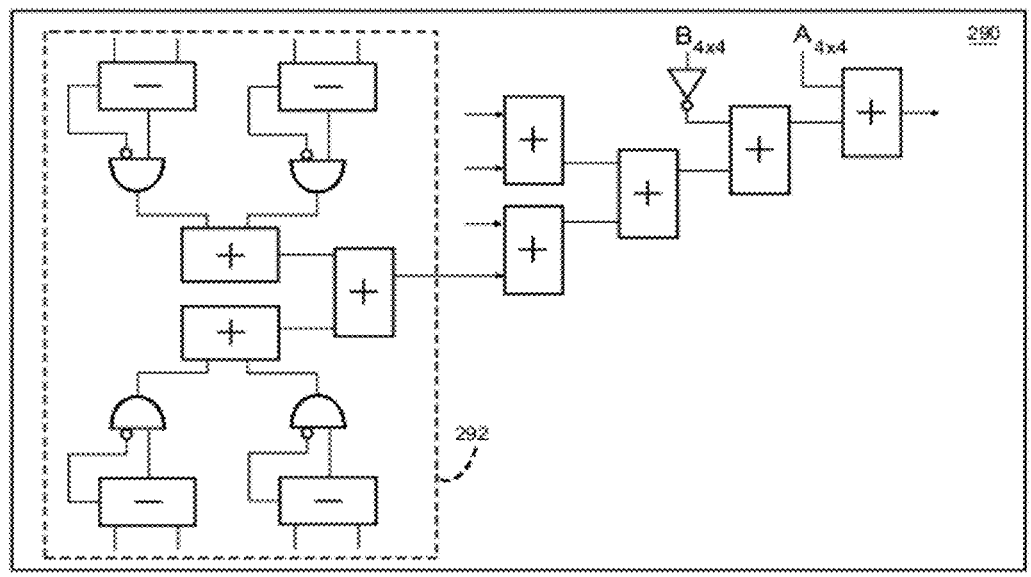
FIG. 19 is a schematic diagram of an integer SAD calculating circuit using an intermediate term according to embodiments of the invention.
Figure 20:
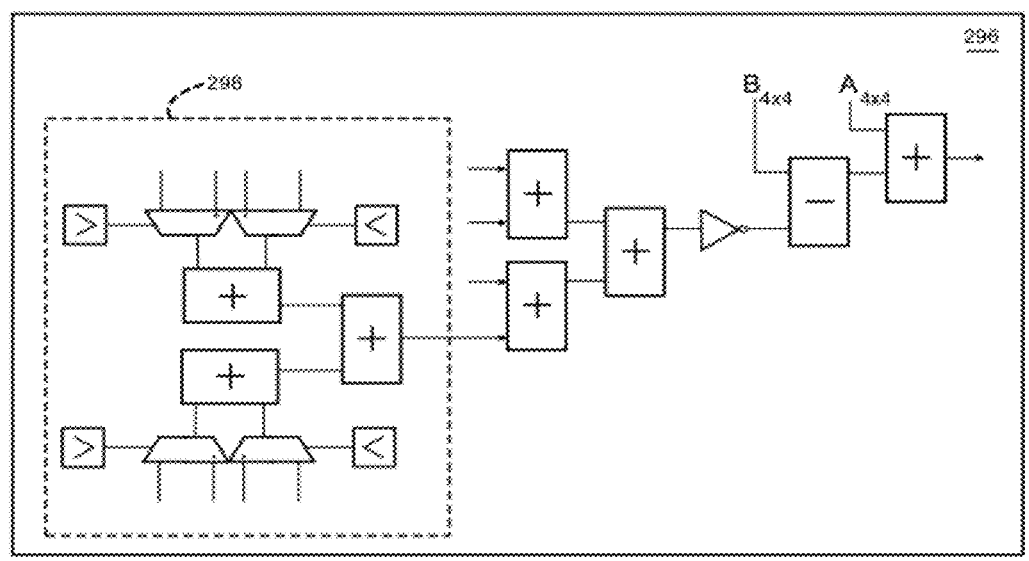
FIG. 20 is a schematic diagram of an integer SAD calculating circuit using a minimum determination element according to embodiments of the invention.

There are three interesting architectures for computing the SAD at integer pixel samples, which are illustrated in FIGS. 18, 19, and 20. FIG. 18 illustrates a 4×4 SAD core element 280, which is similar to the SAD calculating component 220 of FIG. 3. There is a difference, however, in that the core element 280 of FIG. 18 computes the SAD using an EXOR negation. The circuit area 282 computes a 2×2 SAD value and four 2×2 SAD values are summed to create the 4×4 SAD value. Using a typical Standard Cell library, it takes 2142 equivalent NAND gates to implement the core element 280 of FIG. 18.

Intermediate Term

FIG. 19 shows a 4×4 SAD core element 290 that computes the SAD using an intermediate term defined by Equation 22.

$$SAD = \sum_i a_i - \sum_i b_i + 2 \sum_i \begin{cases} 0 & b_i - a_i < 0 \\ b_i - a_i \end{cases} \quad \text{Equation (22)}$$

The circuit area 292 computes a 2×2 SAD value and four 2×2 SAD values are summed to create the 4×4 SAD value. Using a typical Standard Cell library, it takes 2138 equivalent NAND gates to implement the core element 290 of FIG. 19.

Minimum Term

FIG. 20 shows a 4×4 SAD core element 296 that computes the SAD using an intermediate term as shown in Equation 23.

$$SAD = \sum_i a_i + \sum_i b_i - 2\sum_i \min(a_i, b_i) \quad \text{Equation (23)}$$

The circuit area 298 computes a 2×2 SAD value and four 2×2 SAD values are summed to create the 4×4 SAD value. Using a typical Standard Cell library, it takes 1994 equivalent NAND gates to implement the core element 298 of FIG. 20. As previously described, the disadvantage of embodiments using a system according to FIG. 20 over the one shown in FIG. 19 is that a sliding arithmetic cannot be used.

As an example operation, assume that group a is a 2×2 block having values of {1, 2, 4, 1} and group b is a 2×2 block having values of {3, 1, 4, 4}. In operation, Equation 23 can sum the members of the two groups, a, and b at any time to compute that $a_{tot}$=8 and $b_{tot}$=12, which then sum to 20. Then, as directed by Equation 23, each minimum term for each location in the 2×2 matrices is selected and added together. Thus the minimum group is {1, 1, 4, 1}, whose members total 7. By subtracting twice this value, 14, from the originally summed value of $a_{tot}$+$b_{tot}$=20 yields a SAD of 6. If a conventional SAD process is used, it would sum the absolute differences in every common location of a and b, i.e. 2+1+0+3 which also equals a SAD of 6. Differences used by equation 23 include the fact that the sums for $a_{tot}$ and $b_{tot}$ can be "pre" computed and are constant values for many comparisons, and that selecting the minimum of two values is much smaller and faster in hardware than calculating an absolute value which requires two subtractions and a multiplexer.

Integer SAD Sliding

The architecture shown in this section uses the sliding arithmetic described above. The basis is the intermediate term architecture shown in FIG. 19 because each of the terms in the correction summation given by Equation 24 is:

positive small if the final 4×4 SAD is small, as described by sliding arithmetic.

$$\sum_i \begin{cases} 0 & b_i - a_i < 0 \\ b_i - a_i \end{cases} \quad \text{Equation (24)}$$

Figure 21:
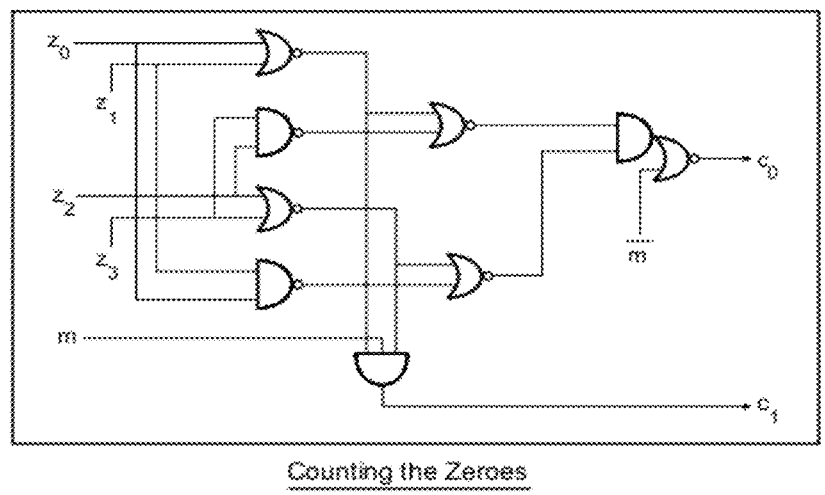
FIG. 21 is a schematic diagram illustrating logic to generate two carry in terms according toe embodiments of the invention.
Figure 22:
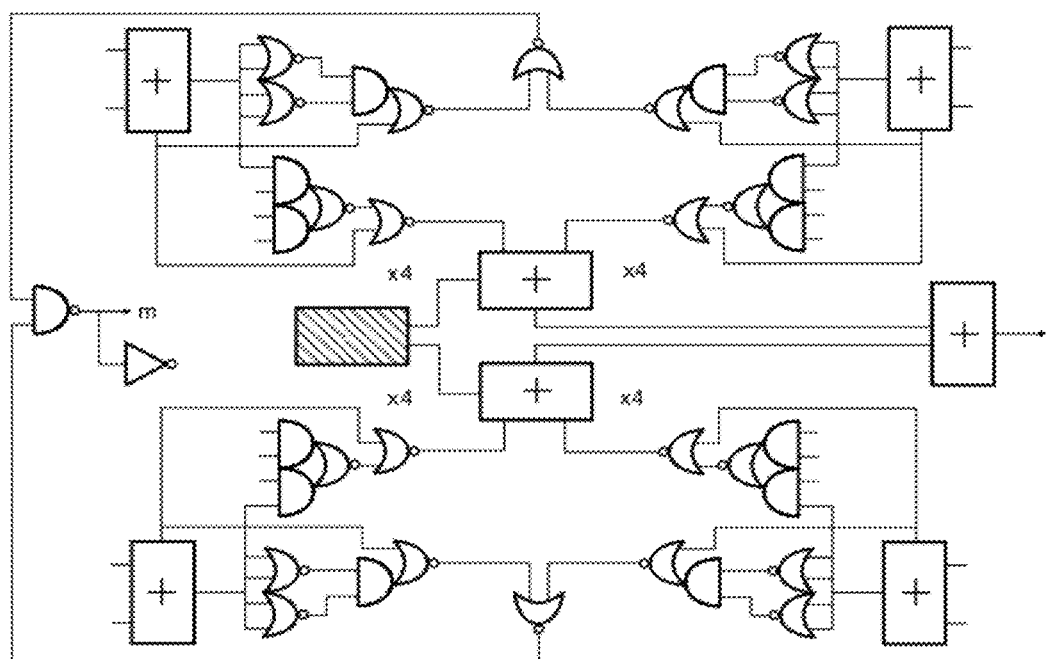
FIG. 22 is a schematic diagram of a 2×2 SAD calculating circuit according to embodiments of the invention.

FIG. 22 shows a 2×2 SAD computation only. In this case, the sliding arithmetic uses no absolute value logic, but can generate zero values often. This means that the rounding for the sliding arithmetic must add 0, 1 or 2 depending on the number of zeroes. FIG. 21 shows the logic to generate the two carry-in terms from FIG. 17.

In FIG. 22 the first two summation adders are 4-bit adders and the carry-in term to each is computed by the shaded block which represents the logic gates of FIG. 21. The sign-bits from the initial adders explicitly zero the summation term and so are the inputs to the shaded block along with the m-bit value computed in FIG. 22.

The initial adders subtract the reference values from the candidate values. This is done by the four initial 8-bit adders of FIG. 22 using pre-computed inverted reference values and an implicit carry-in value of one.

The final summation adder of FIG. 22 is a 5-bit adder with an implicit carry-in value of zero. The outputs are an m-bit indicating whether the 6-bit output value has been slid or not.

Figure 23:
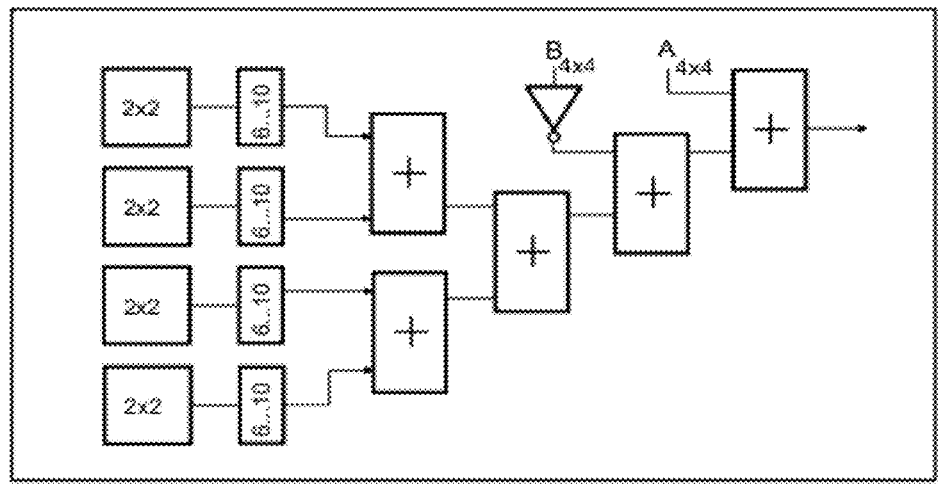
FIG. 23 is a block diagram illustrating the 2×2 logic of FIG. 22 incorporated into a 4×4 SAD computation core according to embodiments of the invention.

To complete the 4×4 SAD computation core, four instances of the 2×2 logic in FIG. 22 are connected together as shown in FIG. 23. The sliding 6-bit values are immediately converted to unsigned 10-bit values which are then summed using two 10-adders and an 11-bit adder in a summation tree. The carry-in terms for the three summation adders are an implicit zero value. The 6-bit to 10-bit decompression uses the circuit detailed in FIG. 14.

Using a typical Standard Cell library, FIG. 23 implements in 1841 equivalent NAND gates. The advantages of using an example of sliding arithmetic are:

Fewer overall gates in the implementation;

An interesting input filter which emphasizes large difference peaks in a low SAD match.

Integer Array

An example of an integer array is a 16×16 array of 256 instances of a 4×4 SAD core. The array takes a 4×4 array of adjacent 4×4 reference blocks that make up a 16×16 macroblock. The offset between each of the 16 4×4 reference blocks is fixed. A candidate block of size 19×19 pixels is used which fully contains each of the 4×4 blocks moving from a vector offset of (0,0) to (3,3). The 256 array of core cells generates 256 SAD4×4 values for 16 different 4×4 reference blocks, each at 16 different vector offsets.

Thus the array does a complete search in a search window of size 4×4 for a macro-block of size 16×16 in a single cycle.

One of the characteristics of the integer array is that each of the 256 matches only depends on the input pixel data, not on neighbors' results. Thus the array is simply that: an array of 256 independent elements that can be put together however desired.

Fractional Array

The fractional array is a 16×16 array of 256 "instances" of a 4×4 SAD core. The exact arrangement and count of instances will be described in various combinations below. The array takes a single 4×4 reference block. A candidate block of size 20×20 pixels is used, which fully contains the 4×4 block moving from an vector offset of (0,0) to (15,15). The 256 array of core cells generates 256 SAD4×4 values for a single 4×4 reference block at 256 different offsets.

Thus the array does a complete search in a search window of size 16×16 for a sub-block of size 4×4 in one cycle. It therefore takes 16 cycles to do a search window of size 16×16 for a macro-block of size 16×16. Note that the search window is counting interpolated points; the actual window in integer samples is 4×4 as the example is q-pel.

One of the characteristics of the fractional array is that each of the 256 matches use the same reference data and can therefore share dependent intermediate terms once the input data is presented.

Figure 24:
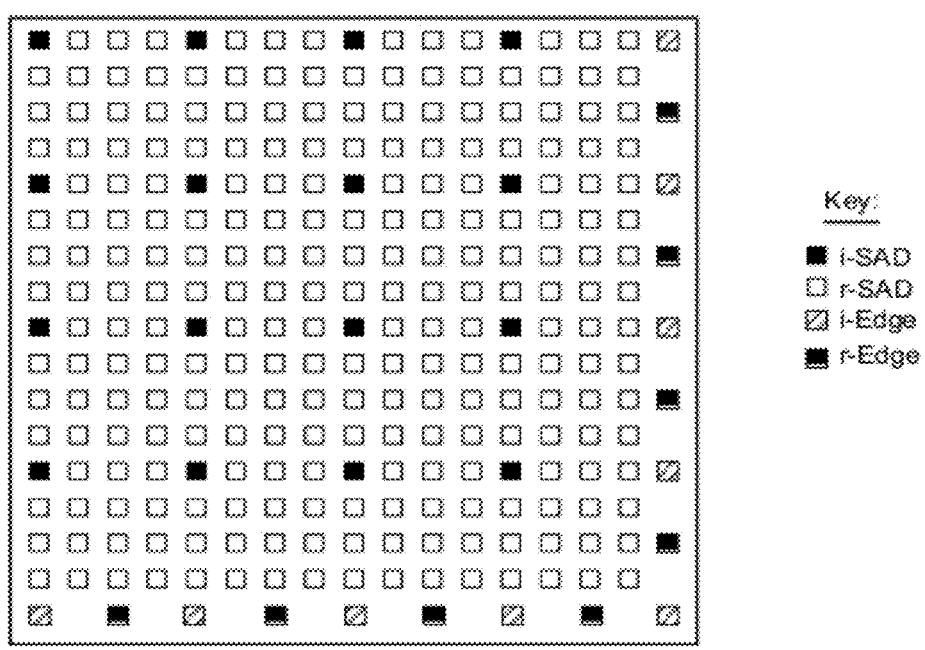
FIG. 24 is a block diagram illustrating a fractional array of SAD computation engines, including four different calculation processor types according to embodiments of the invention.

A more detailed map of the fractional array is shown in FIG. 24. The array consists of two types of 4×4 SAD computation, the i-SAD and r-SAD cores. There are 16 i-SAD cores and 240 r-SAD cores. To ensure the intermediate term dependencies, 9 i-Edge and 8 r-Edge cores are also used. The edge cores are a much stripped down version of the SAD cores which generate the intermediate terms but do not perform the summations or generate SAD values.

Fractional SAD Exact

There are four core types used in the fractional array: i-SAD, r-SAD, i-EDGE and r-EDGE.

Figure 25:
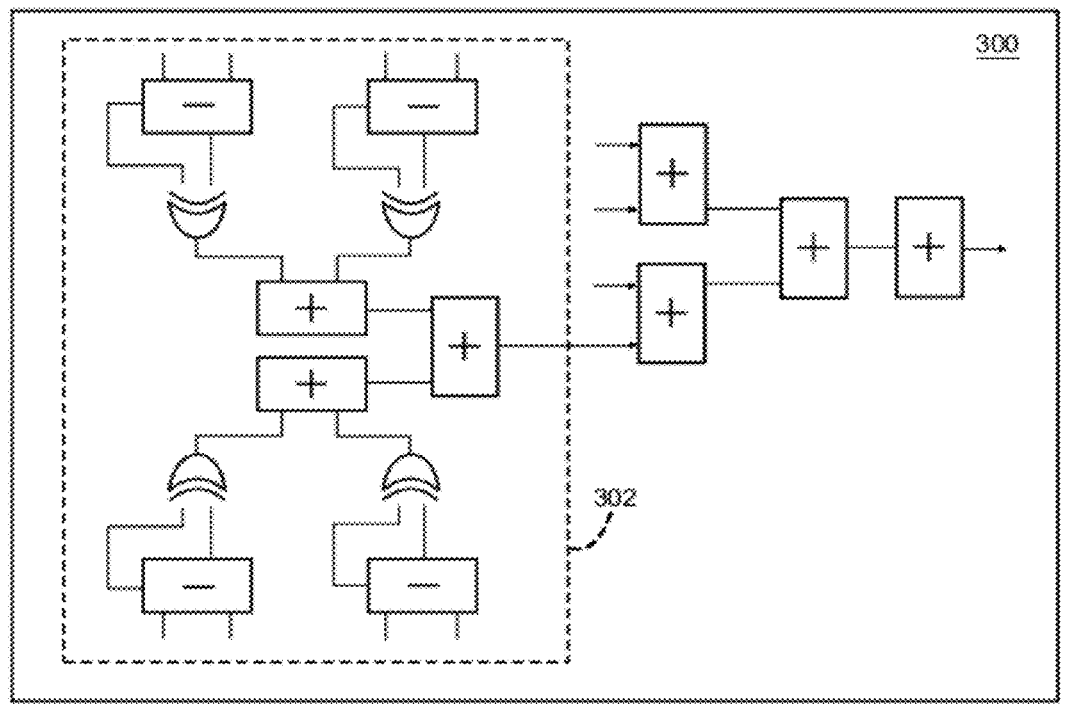
FIG. 25 is a schematic diagram of an integer SAD "exact" calculating circuit according to embodiments of the invention.

FIG. 25 shows an i-SAD 4×4 SAD core element 300 that computes the SAD using an absolute difference. The circuit area 302 computes a 2×2 SAD value and four 2×2 SAD values are summed to create the 4×4 SAD value. Using a typical Standard Cell library, FIG. 25 implements using 2142 equivalent NAND gates.

The core 300 output is not just the SAD4×4 value, but the 16 intermediate terms for the neighbors. The basic equation used by FIG. 25 is:

$$SAD = \sum_i |a_i - b_i| \quad \text{Equation (25)}$$

Figure 26:
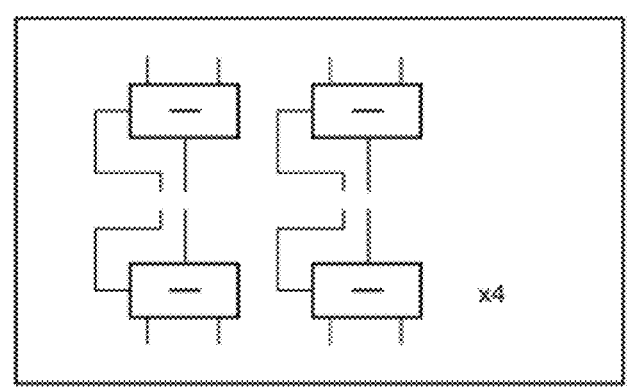
FIG. 26 is a schematic diagram of a stripped-down edge core that generates only intermediate terms according to embodiments of the invention.

The output intermediate terms of FIG. 26 are given by:

$$IT = \frac{a_i - b_i}{2}$$

which are simply the outputs of the initial subtract stages, shifted right by one place. Since the IT are signed values, the sign-bit of each is simply the carry-out term of the subtract unit.

FIG. 26 shows the stripped down i-EDGE core element that generates just the intermediate terms. Using a typical Standard Cell library, FIG. 26 implements using 960 equivalent NAND gates.

r-SAD

Figure 27:
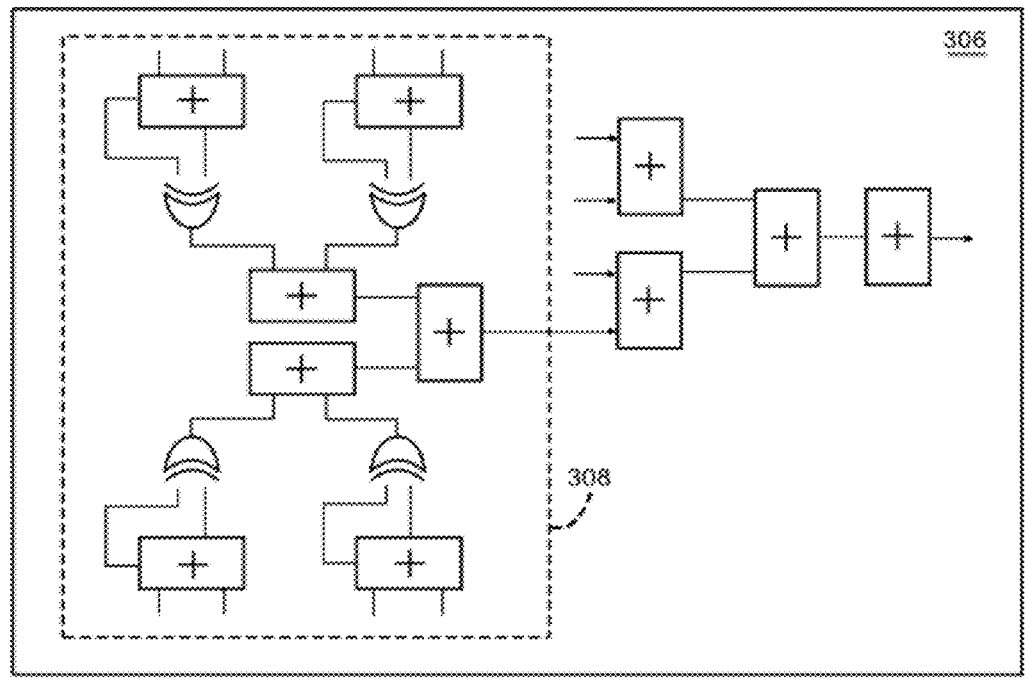
FIG. 27 is a schematic diagram of a 4×4 SAD core element that computes SAD values using absolute value according to embodiments of the invention.

FIG. 27 shows a 4×4 SAD core element 306 that computes the SAD using an absolute difference. The circuit area 308 computes a 2×2 SAD value and four 2×2 SAD values are summed to create the 4×4 SAD value. Using a typical Standard Cell library, FIG. 27 implements using 2142 equivalent NAND gates.

Figure 28:
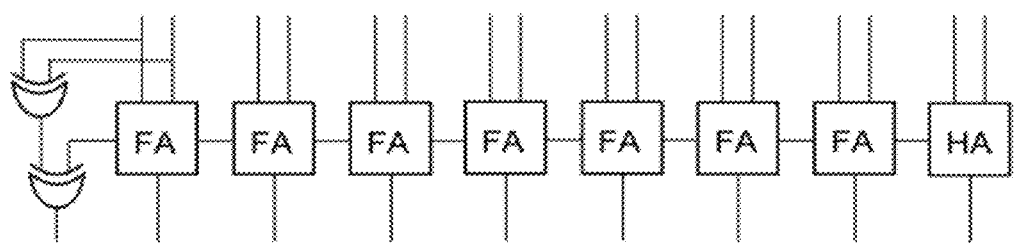
FIG. 28 is a block diagram illustrating a circuit that generates a correct sign in a carry-out term according to embodiments of the invention.

The signed 8-bit adder initially has to sign extend to generate the correct sign in the carry-out term. This logic is shown in detail in FIG. 28. In FIG. 28, the adders HA are the usual half-adder functions provided in any library or text book, as are the full adders FA.

The adders 308 in FIG. 27 are the sign-extended adder of FIG. 28. The critical output is not simply the SAD4×4 value, but the 16 intermediate terms for the neighbors.

The equation used by FIG. 28 is:

$$SAD = \sum_{m,n} |IT_m + IT_n| \quad \text{Equation (26)}$$

The output intermediate terms of FIG. 28 are given by:

$$IT_i = \frac{IT_m + IT_n}{2}$$

which are simply the outputs of the shaded adder stages, shifted right by one place. Since the $IT_i$ are signed values, the sign-bit of each is simply the carry-out term of the adder.

Figure 29:
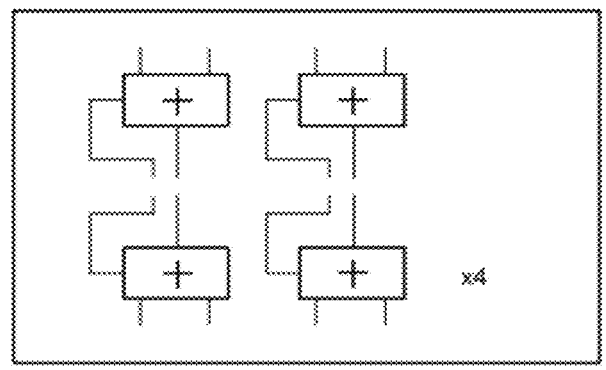
FIG. 29 is a schematic diagram of a stripped-down edge core that generates only intermediate terms according to embodiments of the invention.

FIG. 29 shows the stripped down r-EDGE core element that generates just the intermediate terms. Again, the shaded adders are the sign-extended adder of FIG. 28. Using a typical Standard Cell library, FIG. 28 implements using 960 equivalent NAND gates.

Fractional SAD Sliding

The architecture shown in this section uses the sliding arithmetic described above. Because both the i-SAD and the r-SAD perform the summation directly as shown in Equation 27, sliding arithmetic is permitted because each of the terms in the summation is:

positive, after taking the absolute value
small if the final SAD or SAT value is small.

$$SAD = \sum_i |a_i - b_i| \quad \text{Equation (27)}$$

$$SAT = \sum_{m,n} |IT_m + IT_n|$$

As in the fractional array, there are four core types used in the sliding fractional array: i-SAD, r-SAD, i-EDGE and r-EDGE.

i-SAD

Figure 30:
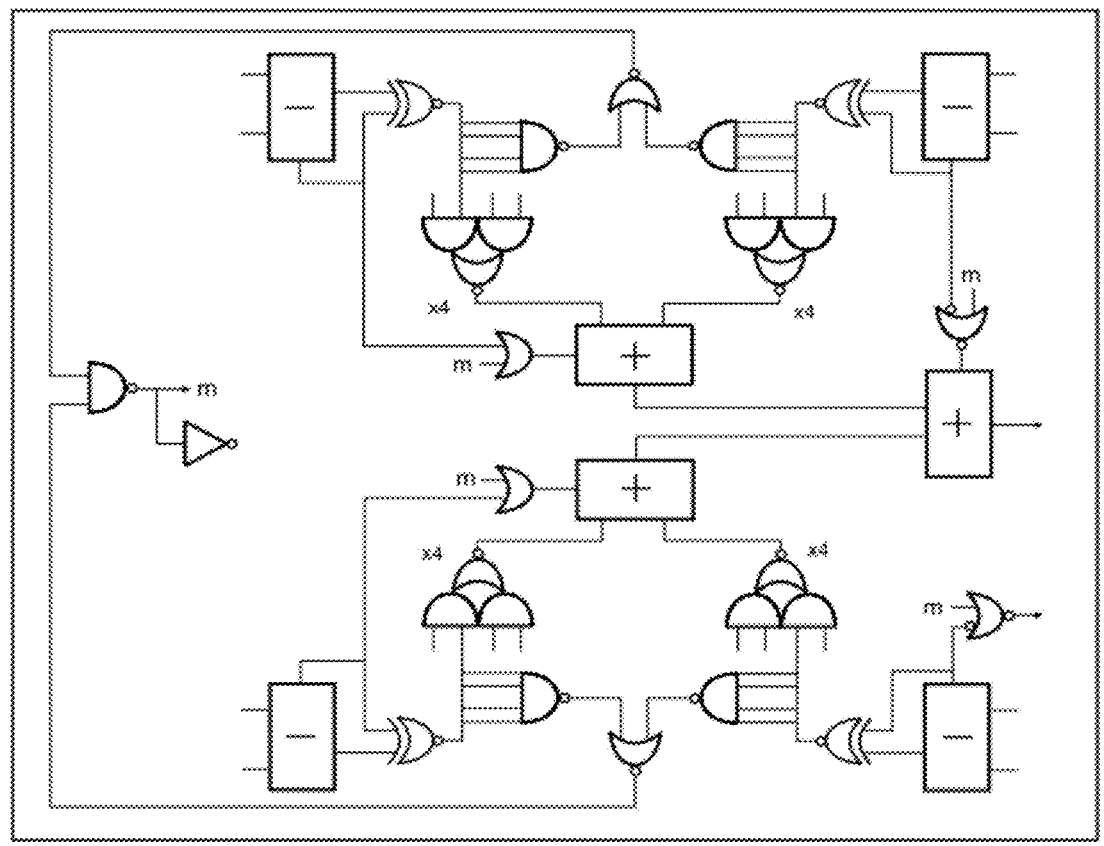
FIG. 30 is a schematic diagram of a 2×2 SAD calculating circuit using absolute value logic according to embodiments of the invention.

FIG. 30 shows a 2×2 SAD computation only. In this case, the sliding arithmetic uses absolute value logic and so must round according the case #2, detailed above in the section titled "Rounding". With reference to FIG. 30 this means that the four sign-bits are added to the three carry-in terms available, with the fourth becoming an output carry when the sliding m-bit is de-asserted; when the sliding m-bit is asserted, two of the carry-in terms are asserted and used internally, with the other two de-asserted.

The outputs are not just the SAD value and its m-bit, but also 16 intermediate terms for the neighbors and an unresolved carry-in term. The basic equation used by FIG. 30 is:

$$SAD = \sum_i |a_i - b_i|$$

The output intermediate terms of FIG. 30 are given by:

$$IT = \frac{a_i - b_i}{2}$$

which are the outputs of the initial subtract stages, shifted right by one place. Since the $IT_i$ are signed values, the sign-bit of each is simply the carry-out term of the subtract unit.

Figure 31:
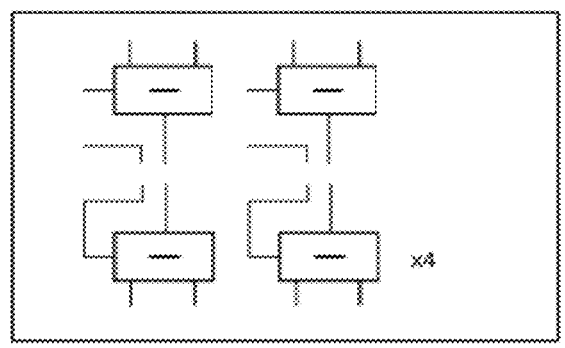
FIG. 31 is a schematic diagram of a stripped-down edge core that generates only intermediate terms according to embodiments of the invention.

FIG. 31 shows the stripped down edge core that generates just the intermediate terms. Using a typical Standard Cell library, FIG. 31 implements using 960 equivalent NAND gates.

Figure 32:
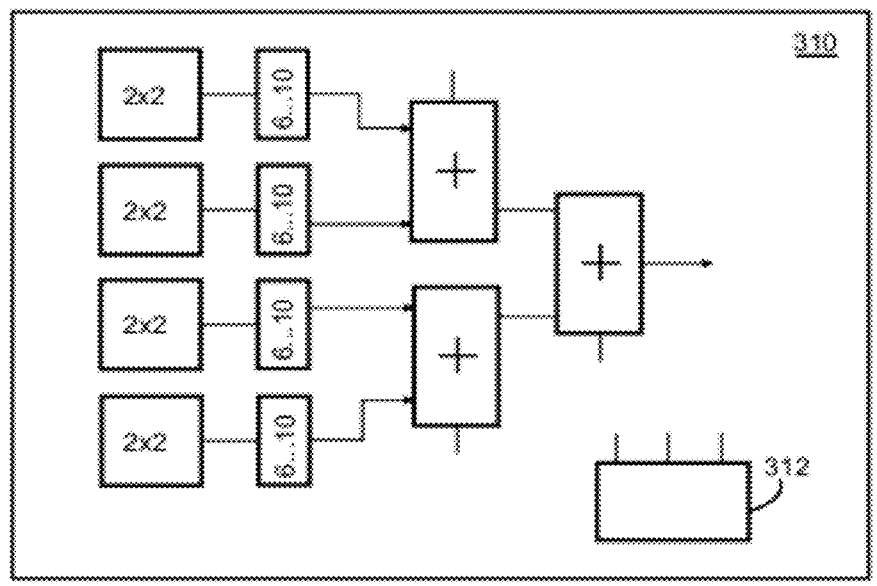
FIG. 32 is a block diagram illustrating a 4×4 i-SAD core made from four instances of the 2×2 SAD calculating circuits of FIG. 30 according to embodiments of the invention.

To complete the 4×4 i-SAD computation core 310, four instances of the 2×2 logic of FIG. 30 are connected together as shown in FIG. 32. The sliding 6-bit values are immediately converted to unsigned 10-bit values which are then summed using two 10-adders and an 11-bit adder in a summation tree. The 6-bit to 10-bit decompression uses the circuit detailed in FIG. 14.

Figure 33:
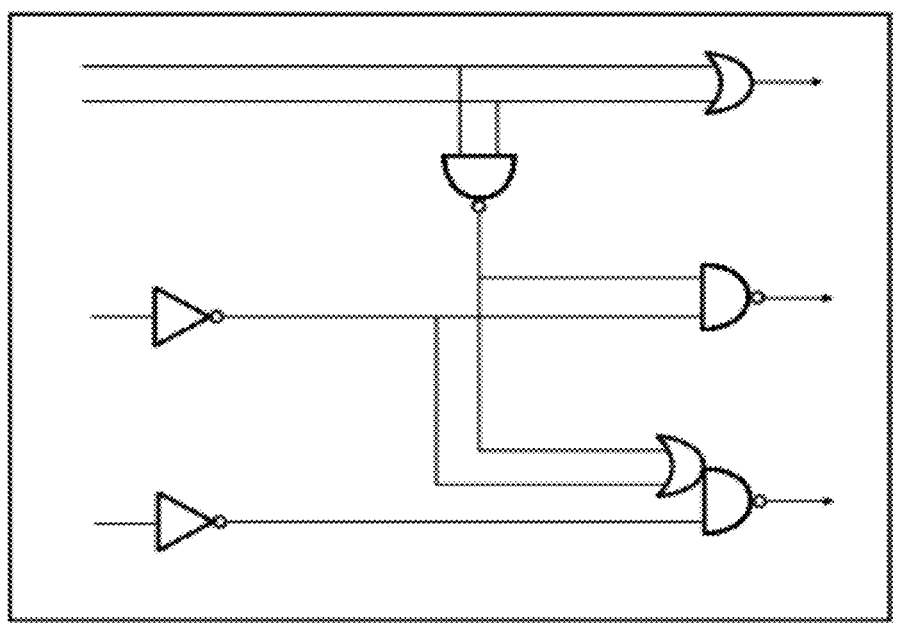
FIG. 33 is a schematic diagram of carry compression logic used in the i-SAD core of FIG. 32 according to embodiments of the invention.

The three carry-in terms available in FIG. 32 are compressed from the four carry outputs generated by the instances of FIG. 33.

The shaded block 312 in FIG. 32 is the carry compression logic of FIG. 33. Using a typical Standard Cell library, FIG. 32 implements in 1998 equivalent NAND gates. The advantages of using sliding arithmetic are:

Fewer overall gates in the implementation;
An interesting input filter which emphasizes occasional difference peaks in a low SAD match.

r-SAD

Figure 34:
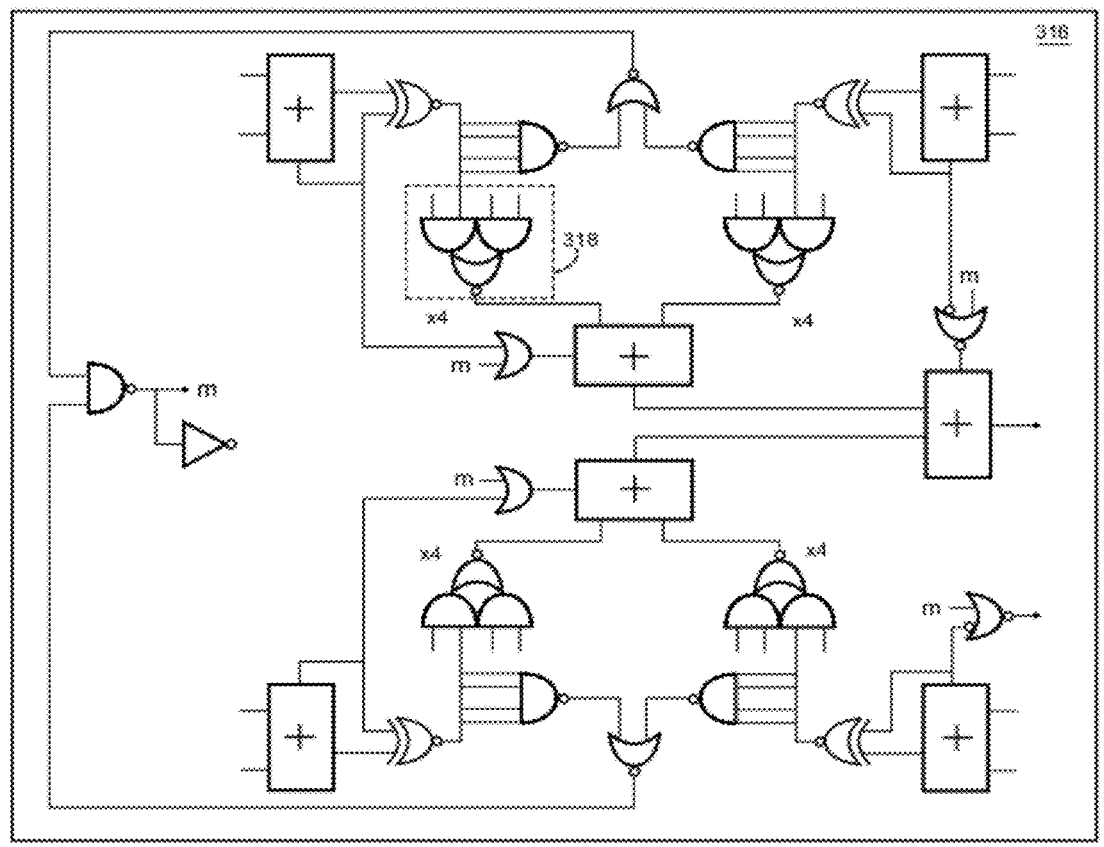
FIG. 34 is a schematic diagram of a 2×2 SAD calculating circuit using sliding arithmetic according to embodiments of the invention.

FIG. 34 shows a 2×2 SAD computation 316 only. In this case, the sliding arithmetic uses absolute value logic and rounds according to the case #2, detailed in "Rounding" above. With reference to FIG. 34 this means that the four sign-bits are added to the three carry-in terms available, with the fourth becoming an output carry when the sliding m-bit is de-asserted; when the sliding m-bit is asserted, two of the carry-in terms are asserted and used internally, with the other two de-asserted.

The adders 318 of FIG. 34 are the sign-extended adders of FIG. 28.

The outputs are not just the SAD value and its m-bit, but also 16 intermediate terms for the neighbors and an unresolved carry-in term. The equation used by FIG. 34 is:

$$SAT = \sum_{m,n} |IT_m + IT_n|$$

The output intermediate terms of FIG. 34 are given by:

$$IT_i = \frac{IT_m + IT_{ni}}{2}$$

which are simply the outputs of the shaded adder stages, shifted right by one place. Since the $IT_i$ are signed values, the sign-bit of each is simply the carry-out term of the adder.

Figure 35:
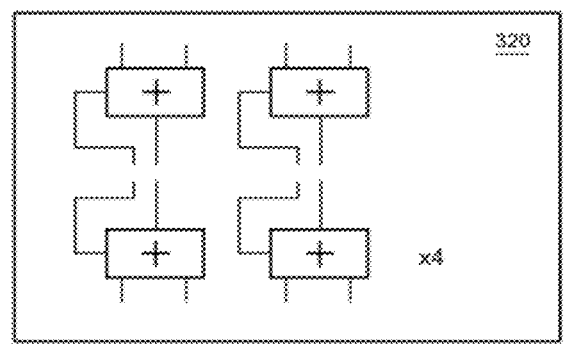
FIG. 35 is a schematic diagram of a stripped-down edge core that generates only intermediate terms according to embodiments of the invention.

FIG. 35 shows the stripped down i-EDGE core element that generates just the intermediate terms. Again, the adders 320 are the sign-extended adder of FIG. 28. Using a typical Standard Cell library, FIG. 35 implements using 960 equivalent NAND gates.

Figure 36:
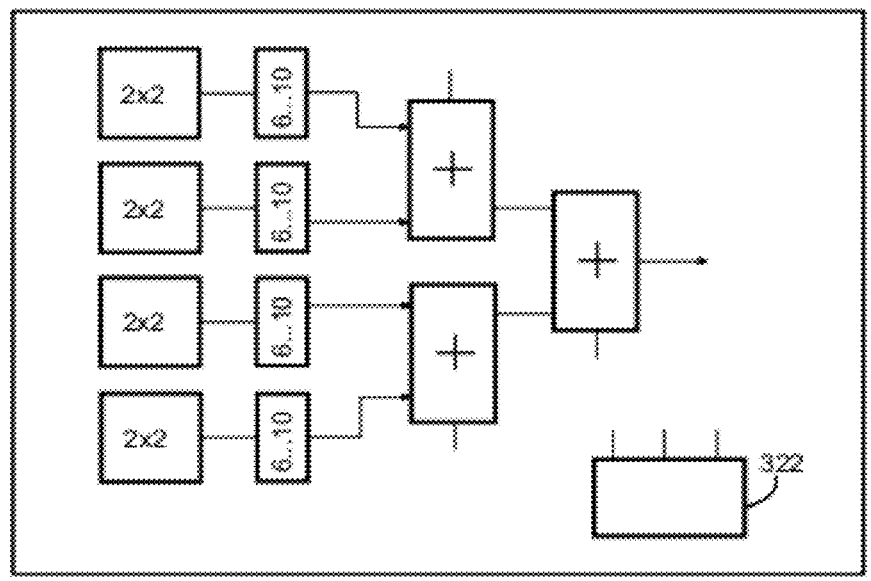
FIG. 36 is a block diagram illustrating a 4×4 i-SAD core made from four instances of the 2×2 SAD calculating circuits of FIG. 34 according to embodiments of the invention.

To complete the 4×4 i-SAD computation core, four instances of the 2×2 logic of FIG. 34 are connected together as shown in FIG. 36. The sliding 6-bit values are immediately converted to unsigned 10-bit values which are then summed using two 10-adders and an 11-bit adder in a summation tree. The 6-bit to 10-bit decompression uses the circuit detailed in FIG. 14.

The three carry-in terms available in FIG. 36 are compressed from the four carry outputs generated by the instances of FIG. 34. The compression is done using the circuit of FIG. 33.

The shaded block 322 in FIG. 36 is the carry compression logic of FIG. 33. Using a typical Standard Cell library, FIG. 36 implements in 1998 equivalent NAND gates. The advantages of using sliding arithmetic are:

Fewer overall gates in the implementation;
An interesting input filter which emphasizes occasional difference peaks in a low SAD match.

H.264 Final Search

Figure 37:
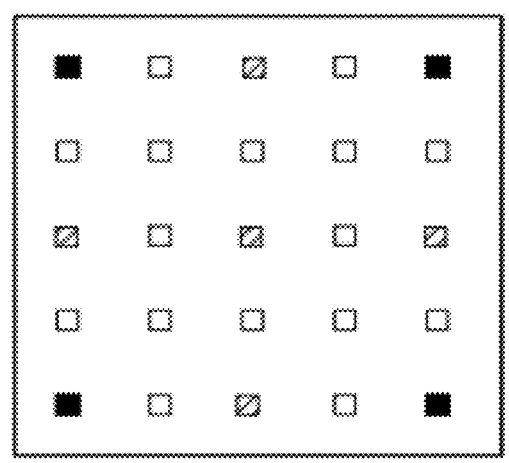
FIG. 37 is a block diagram illustrating a final search block according to embodiments of the invention.

When the best matches have been determined using integer and/or fractional arrays as described, a final search block can be used that performs a detailed 5×5 search with integer samples in each corner. The offsets used in the search are shown below in FIG. 37; they range from (0,0) to (1.0,1.0) in steps of 0.25. The block is designed to search for each one of the 41 sub-partitions in H.264 separately. The purpose of the final search is to correct for any potential errors created by not using the full 6-tap Weiner interpolation filter for h-pel samples. If there is one SAD value that dominates (is the smallest), then using a bi-linear filter will select the same vector offset as the Weiner filter. However, if there are a number of small SAD values, then the Weiner filter may have chosen a different vector. In this case, the SAD values are crowded around a minimum which the bi-linear approximation has found—hence the final search block, which uses the Weiner filter to determine which of the surrounding vectors is the best choice.

Figure 38:
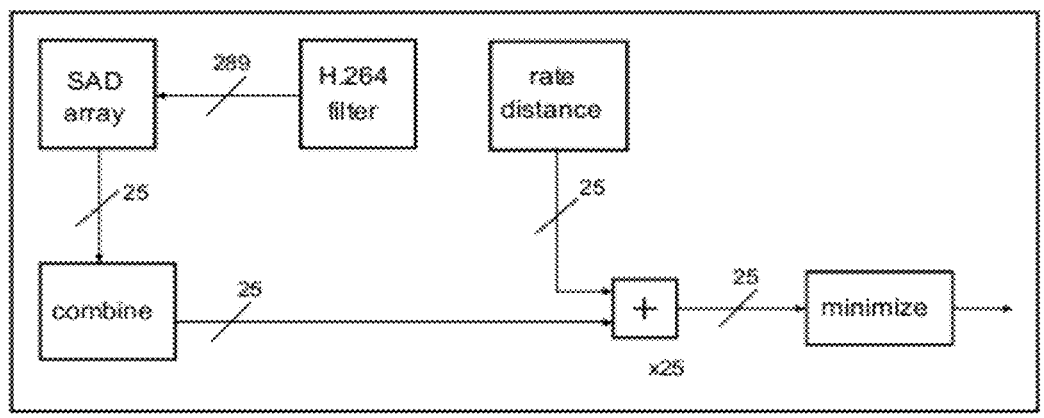
FIG. 38 is a block diagram of an H.264 final search process according to embodiments of the invention.

The basic architecture is shown in FIG. 38. A 5×5 SAD array computes 25 SAD4×4 values each cycle for one 4×4 reference block at 25 different offsets. These values are combined across different cycles to create the SAD values for the 4×8, 8×4, 8×8, 8×16, 16×8 and 16×16 block-sizes. FIG. 38 can take a complete reference 16×16 block and present a different 4×4 sub-block into the SAD array each cycle for up to 16 cycles. The H.264 filter block takes a 21×21 pixel array and computes 289 interpolated input samples for the SAD array on each cycle.

FIG. 38 also shows a rate distance block generating 25 rate values which are added to the SAD values so that a true rate measure is minimized in the minimize block of FIG. 38.

The following Cycle Table shows how many cycles the combine block in FIG. 38 takes to compute the SAD values of the appropriate size. When the combine block has finished, and only then, the 25 values at each offset are output to the adder.

| Cycle table: | |
| --- | --- |
| Sub Block Size | Cycles |
| 4 × 4 | 1 |
| 4 × 8 | 2 |
| 8 × 4 | 2 |
| 8 × 8 | 4 |
| 8 × 16 | 8 |
| 16 × 8 | 8 |
| 16 × 16 | 16 |

H.264 Interpolating Filter

Figure 39:
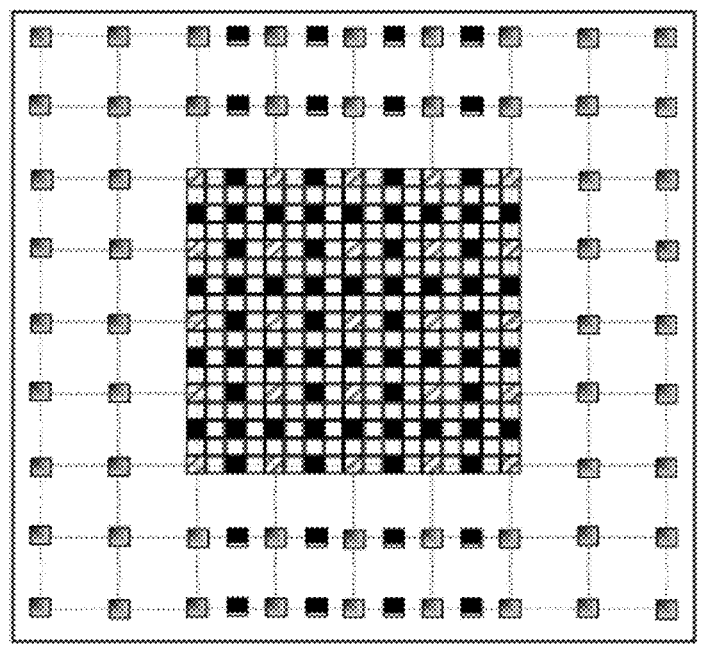
FIG. 39 is a block diagram illustrating samples generated to match a 4×4 reference block in a 5×5 window according to embodiments of the invention.

FIG. 39 shows the samples used to match a 4×4 reference block in the 5×5 window.

It can be seen that there are 25 integer samples, 56 half-pel samples and 208 quarter-pel samples used for the search. Note that an extra 16 half-pel samples are also generated so that they may be used in the calculation, but are not used by the search.

Figure 40:
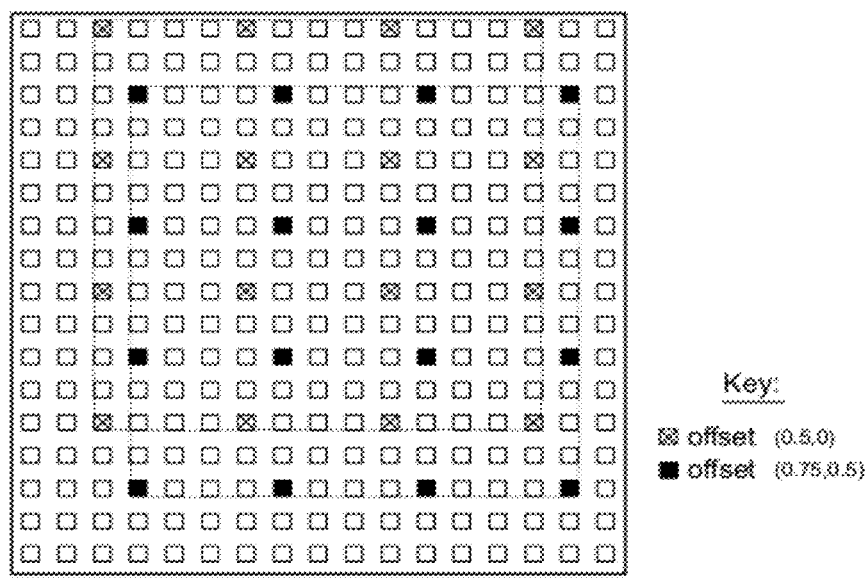
FIG. 40 is a block diagram illustrating two sets of comparison points at various offsets calculable using embodiments of the invention.

FIG. 40 shows two sets of comparison points, one set at an offset of (0.5,0) and the other set at an offset of (0.75,0.5), within the 5×5 search area defined by the center of FIG. 39. Each set represents 16 samples the input 4×4 reference block is compared with. Note that the spacing between the samples is 1.0 pixels, since the reference block is always original pixel values which are on-grid.

The interpolation filters are implemented directly from Equation-7 and Equation-8. If implemented using a typical Standard Cell library, the cost is (56+16)*732+208*86=72, 056 equivalent NAND gates.

Note that if a 16×16 macro-block refinement is being performed, each of the 16 adjacent 4×4 sub-blocks are input into the H.264 filter separately, one each cycle. The SAD array automatically reads the appropriate set of 16 values from the 16×16 reference input values at each cycle.

Combine

The combine block of FIG. 38 uses a sequential algorithm to compute the values for each of the different sub-block sizes. As detailed in the cycle table above, each sub-block size takes a different number of cycles to compute. The combine block takes 25 input values and creates 25 different sums using 25 instances of FIG. 41.

Figure 41:
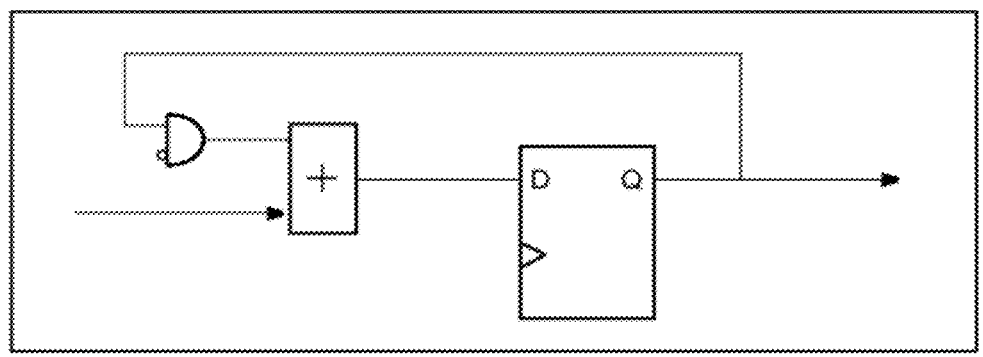
FIG. 41 is a schematic diagram illustrating an adder block that accepts an input and outputs a sum, which is used in embodiments of the invention.

At the start of the sequence, the feed-back value in FIG. 41 is set to zero thus loading the initial SAD4×4 input value into the register of FIG. 41. On subsequent cycles, the input SAD4×4 values are added to the stored value to create the required value at the end of the sequence, when all 25 values are output.

Using a typical Standard Cell library, 25 instances of FIG. 41 implements using 3,208 equivalent NAND gates.

Minimize

Figure 42:
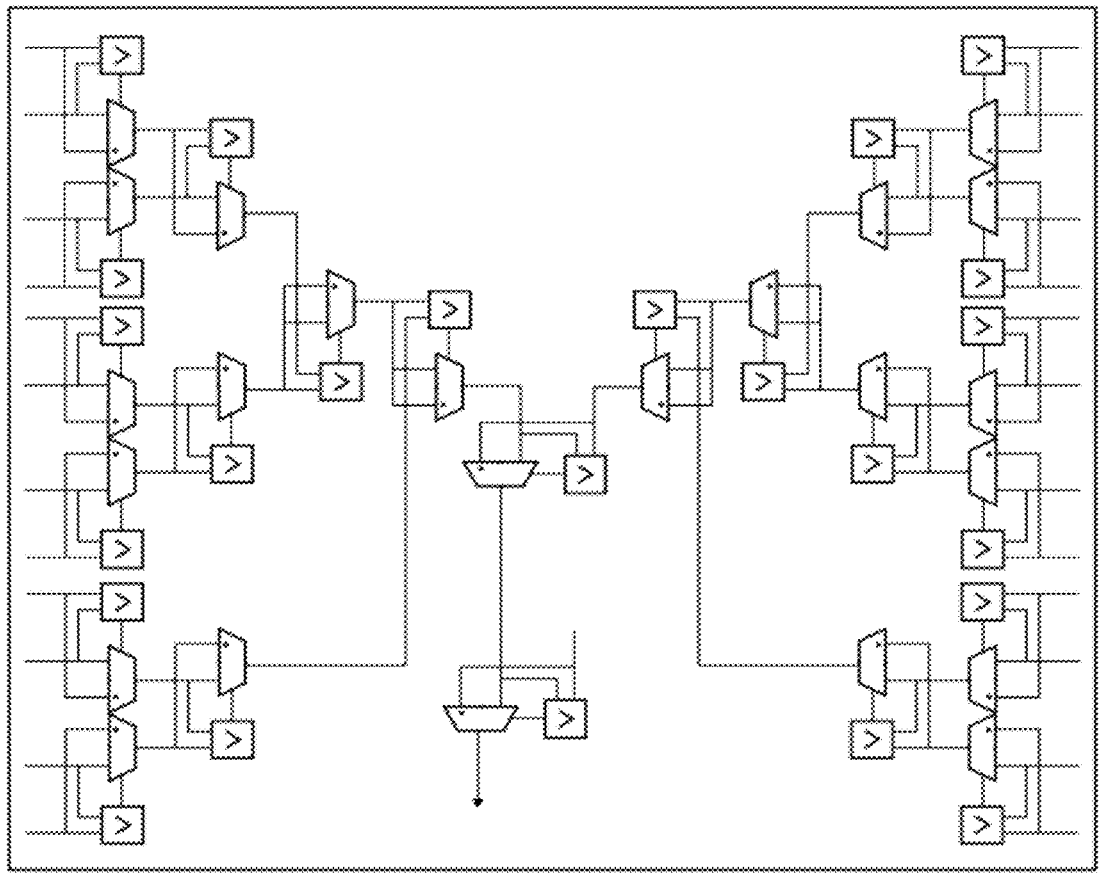
FIG. 42 is a block diagram illustrating a minimizer circuit according to embodiments of the invention.
Figure 43:
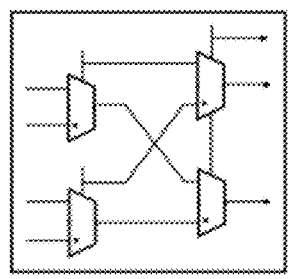
FIG. 43 is a block diagram illustrating a sub-circuit that generates a unique 3-bit ID from 7 inputs, as well as a circuit that generates a unique 5-bit id from 25 inputs.
Figure 43:
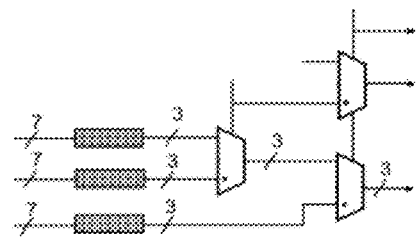

At the end of the cycle sequence, 25 SAD values are output from the combine block in FIG. 38. Each SAD value is added to the appropriate rate distance value from the rate distance block in FIG. 38. The resulting 25 rate values from the adder of FIG. 38 are then minimized using a combination of FIG. 42 and FIG. 43, which are drawn separately for clarity. FIG. 42 uses 24 instances of a "greater than" circuit to perform the comparison. FIG. 43 uses the 24 outputs of the "greater than" circuits of FIG. 42 to create a unique 5-bit ID indicating which of the 25 input SAD values corresponded to the final minimum. In FIG. 43, a sub-circuit which creates a unique 3-bit ID from 7 inputs is used hierarchically, instanced three times, to generate the final 5-bit ID.

The outputs of FIG. 42 and FIG. 43 combined are the minimum of 25 input values and a 5-bit identifier which indicates which input was the minimum.

Using a typical Standard Cell library, FIG. 42 implements using 3,024 equivalent NAND gates, and FIG. 43 implements using 40 equivalent NAND gates.

Rate Distance

The rate distance block of FIG. 38 generates 25 rate distance values. The rate distance is given by:

$$\lambda g(\Delta x, \Delta y)$$

where $\lambda$ is a constant, g is some distance function and $\Delta x$ and $\Delta y$ are the differences of the x and y offsets from a predicted vector.

The final search block of FIG. 38 assumes the function g is separable and odd. This means that:

$$g(x,y)=F(x)+G(y)$$

$$F(-x)=F(x)$$

$$G(-y)=G(y)$$

The user pre-computes the following 10 ten values: F(0), F(1), F(2), F(3), F(4), G(0), G(1), G(2), G(3) and G(4), where the indices indicate multiples of 0.25. Since all block sizes use the same distortion function, these values are fixed once loaded into the rate distance block in FIG. 38. The rate distance block in FIG. 38 allows each block size to have a different predicted vector, but limited to the values of (0,0) to (0.75,0.75). This is the bottom 2-bits of the components of the true predicted vector; the input search window has its top-left at the residue of the predicted vector.

Figure 44:
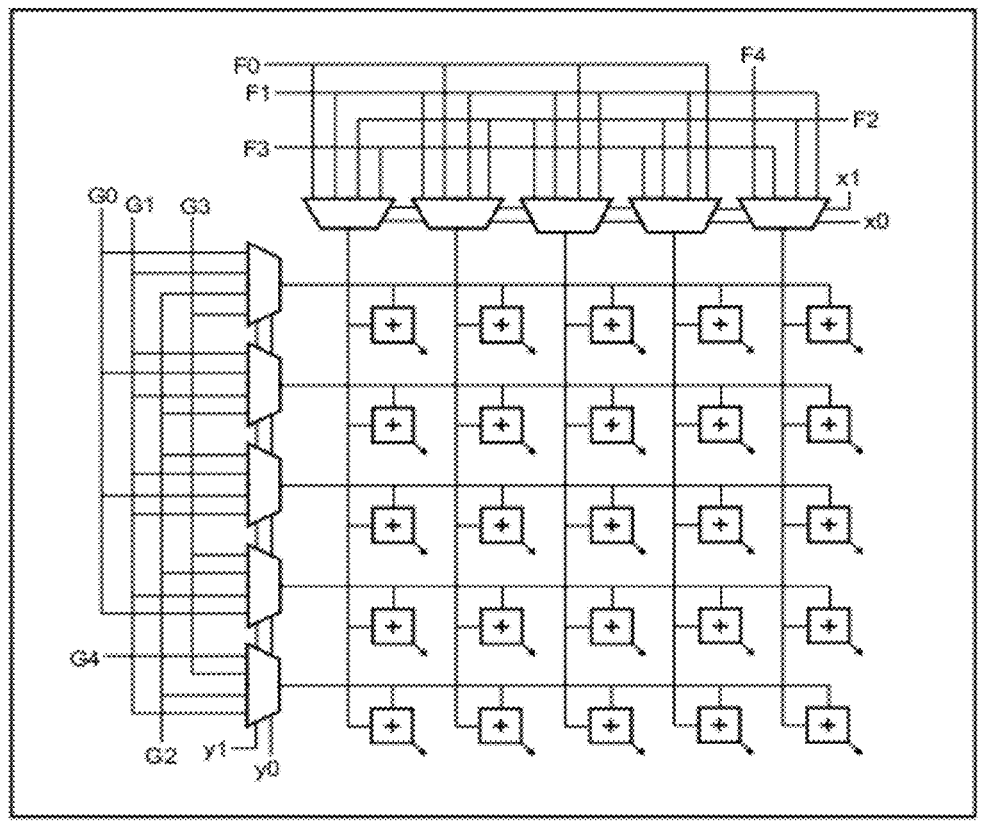
FIG. 44 is a rate distance generator using a set of inputs in both an x and y direction, according to embodiments of the invention.

Note that only positive indices for F and G are used; FIG. 44 makes use of the odd function attribute of F and G, for example F(−1)=F(1).

FIG. 44 shows how the 10 pre-computed F and G values are added together to generate the 25 rate distance values. In FIG. 44, (x1x0, y1y0) is the bottom 2-bits of each component of the predicted vector which can be changed for each search. FIG. 44 maps the appropriate value of F and G into the central adder using a 4-way multiplexer controlled by the predicted vector; for example, the adder at (0,0) requires a value of F(0), F(−1), F(−2) or F(−3) depending on whether x1x0 is 00, 01, 10 or 11 respectively.

Using a typical Standard Cell library, FIG. 44 implements using 3,468 equivalent NAND gates.

The inputs to FIG. 38 are a 16×16 reference pixel block and a 21×21 candidate pixel area; FIG. 38 automatically loads the correct 4×4 sub-blocks into the SAD array for a search that uses a reference block larger than 4×4. By centering the candidate search window, the predicted vector offset is limited to 2-bits. The outputs are a minimum rate (SAD plus rate value) and the offset in the 5×5 array where the minimum value occurred.

Each sub-block takes a different number of cycles to complete, ranging from 1 to 16 cycles. Any input values that are not required are ignored and can be any value; for example when matching a 4×4 sub-block, only 16 of the 256 reference values and only 81 of the 441 candidate pixel values are used.

To completely refine the results for a 16×16 macro-block, FIG. 38 is used 41 times and takes a minimum of 112 cycles.

For a 1080p HD video, there are 8100 16×16 macro-blocks. For a 500 MHz operating frequency and a 60 Hz video update rate, there are 1028 cycles available to process each macro-block. Since there are 41 different sub-blocks to refine, this leaves a budget of 25 cycles to process each sub-block.

| Relative Block sizes, in equivalent NAND gates | |
| --- | --- |
| H.264 Filter: | 72,056 |
| SAD Array: | 49,850 |
| Combine: | 3,208 |
| Minimize: | 5,764 |
| Rate Distance: | 3,468 |
| Total: | 134,346 |

The values in this table illustrate the relative size of each block using the same metric so that the relative comparison is accurate; note that the filter and the SAD array dominate.

Determining an Output when there is More than One Minimum

In this section, a system and methods of finding more than one minimum in a set is discussed. Combinational, pipe-lined and sequential algorithms are included.

By way of an example to demonstrate the general cases, it will be assumed that 16 inputs are presented each cycle, and a minimum list of candidates accumulated over multiple cycles is generated. The output list will be of length 4, and which of two equal is chosen implicitly according to position and connections rather than according to explicit rules.

Minimum of Two

Figure 45:
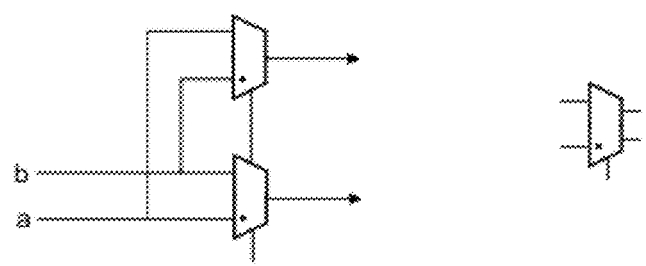
FIG. 45 is a schematic diagram illustrating a conventional two-way selector.

The hierarchy of FIG. 45 is used often in this document section. The circuit of FIG. 45 is a selector that chooses one of two inputs, a and b, and two outputs which are either a or b.

Figure 46:
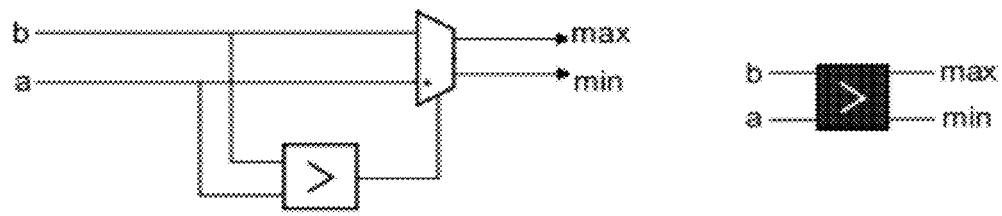
FIG. 46 is a block diagram illustrating a circuit that generates minimum and maximum values from a set of inputs, as used in embodiments of the invention.

The circuit of FIG. 46 is also used extensively in this document section, and uses the circuit of FIG. 45. It takes two values, a and b, and computes which is the maximum, output on max, and which is the minimum, output on min.

Sort Four Values

Figure 47:
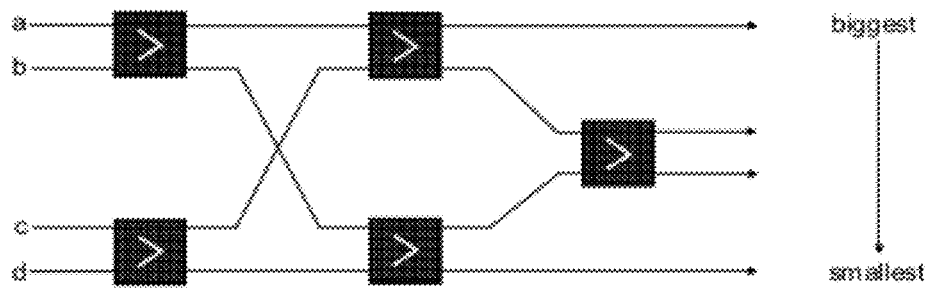
FIG. 47 is a block diagram illustrating a sorting circuit used in embodiments of the invention.

To sort four values the circuit of FIG. 47 is used.

The operation is easy to understand in that:

The maximum value is max(max(a,b), max(c,d));
The minimum value is min(min(a,b), min(c,d));
The next-to-minimum value is the minimum of what's left;
The next-to-maximum value is the maximum of what's left.

Figure 48:
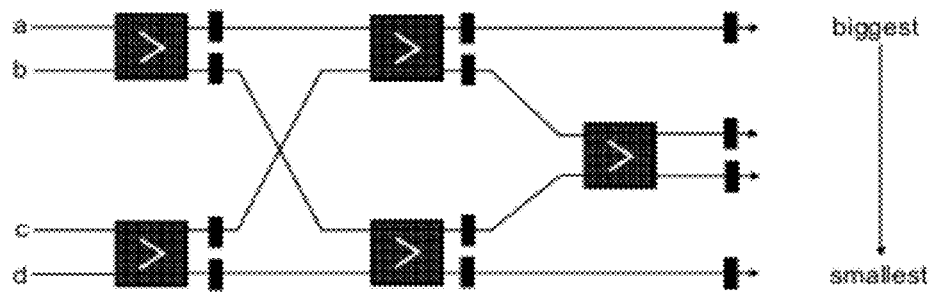
FIG. 48 is a block diagram illustrating a pipelined version of the circuit of FIG. 47.

The circuit of FIG. 47 can be made into a pipe-line by adding pipeline registers, as shown below in FIG. 48. In FIG. 48, the pipeline registers are shown in black.

Manipulating Four-Lists

Inserting a Single Value into a Four-List

Figure 49:
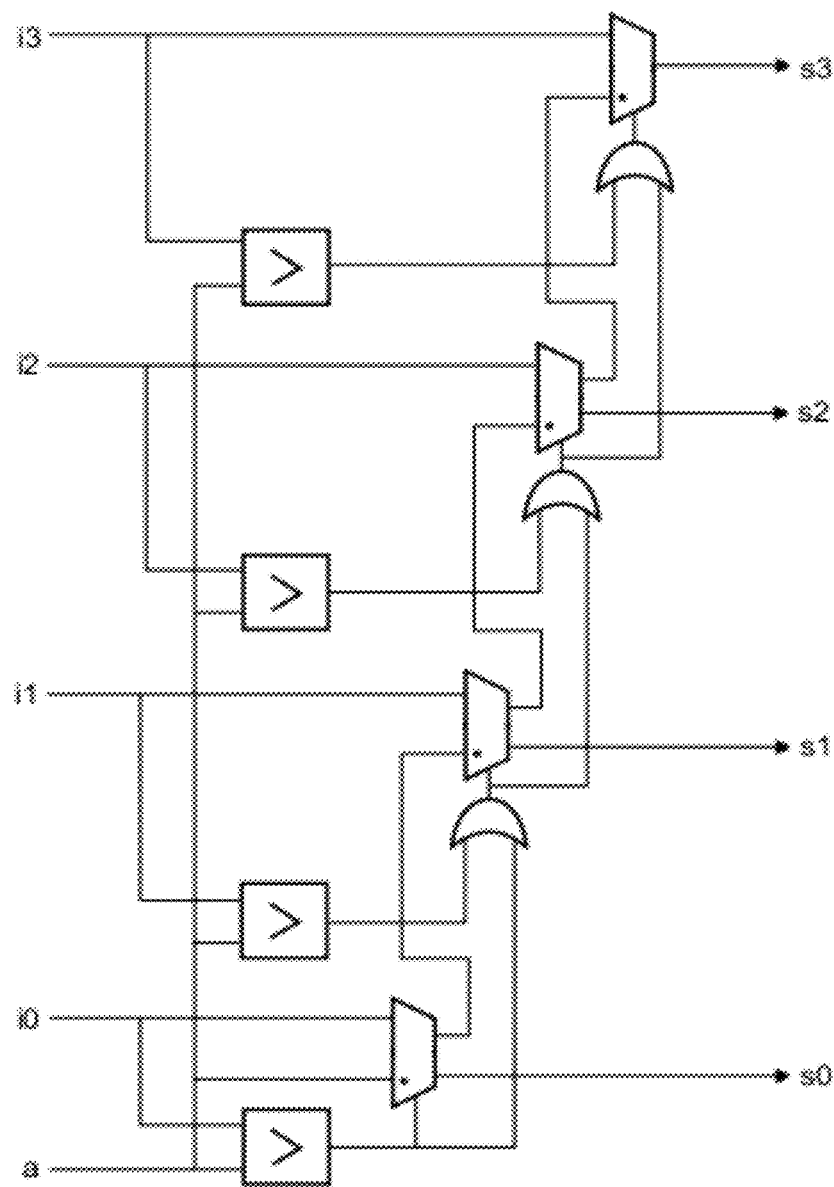
FIG. 49 is a block diagram illustrating a circuit that inserts a value into a sorted list according to embodiments of the invention.

The circuit of FIG. 49 compares a sorted four-list (i0, i1, i2, i3) with a single value a. The output is another sorted four-list (s0, s1, s2, s3). The sorted four-list is four values which are in strict ascending order. For FIG. 49, there are 5 inputs, and so the output sorted four-list is the smallest four values in ascending order.

The following code segment explains the action of inserting a value into an array of length N that holds a sorted list.
//The list stores minimum value at index 0, maximum at index N−1
static void insert(const int a) {
for (int i=0; i<N; i++)
  if (a<list[i]) {
    for (int j=N−1; j>i; j−−)//move everything else up
      list[j]=list[j−1];
    list[i]=a;
    break;//stop looking
  }
}

Figure 50:
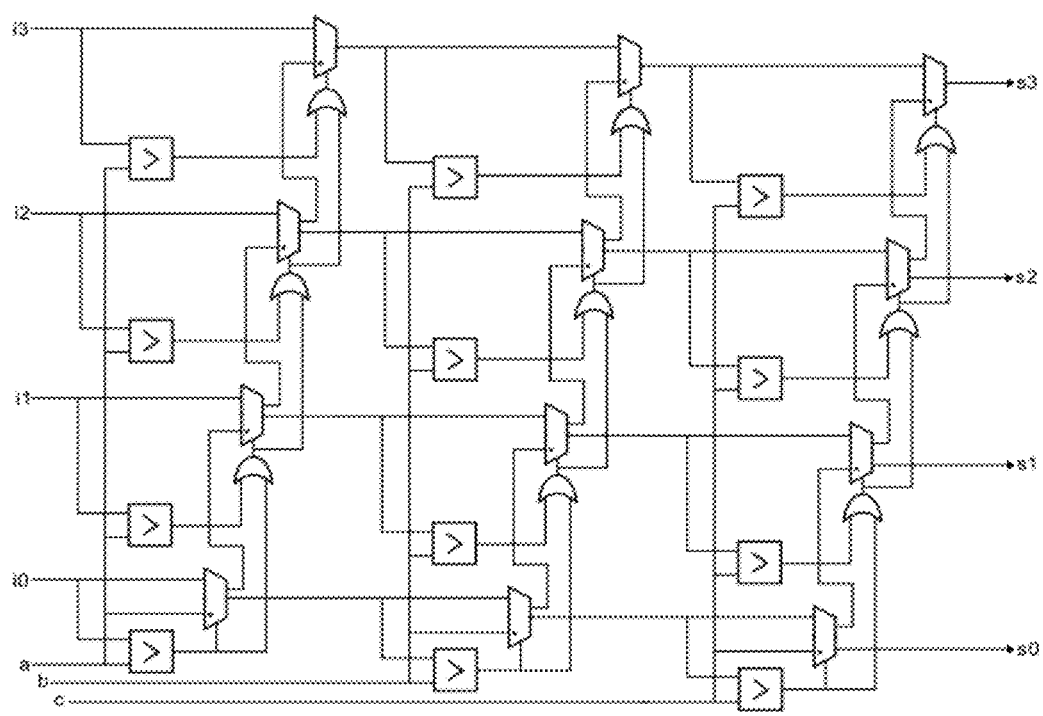
FIG. 50 is a block diagram illustrating a circuit that inserts three values into a sorted list according to embodiments of the invention.

Clearly, FIG. 49 can be cascaded to insert any number of values. An example is shown in FIG. 50, which shows how three values a, b, and c are inserted into the sorted list. Note that the inputs a, b and c do not have to be sorted.

Figure 51:
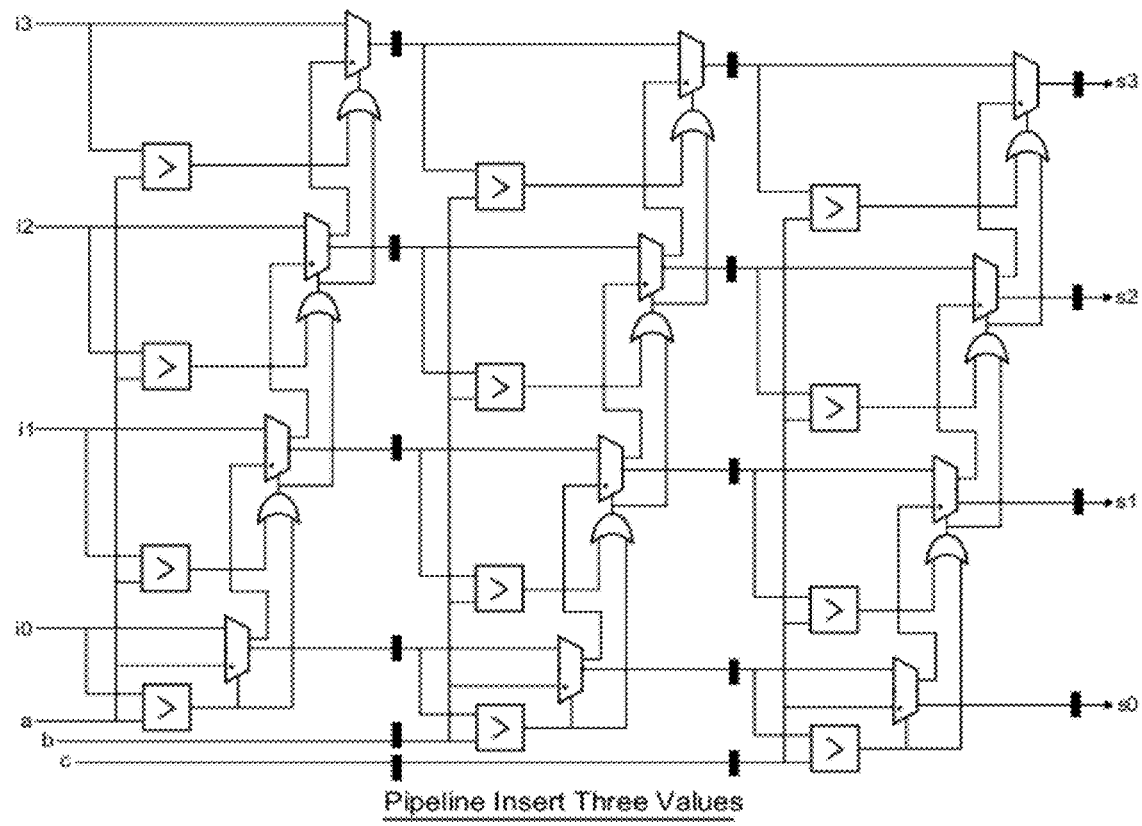
FIG. 51 is a block diagram illustrating a pipelined version of the circuit of FIG. 50.

FIG. 51 extends FIG. 50 into a pipe-line. It can be seen that the pipe-line can be made any length.

Inserting a Four-List into a Four-List

Figure 52:
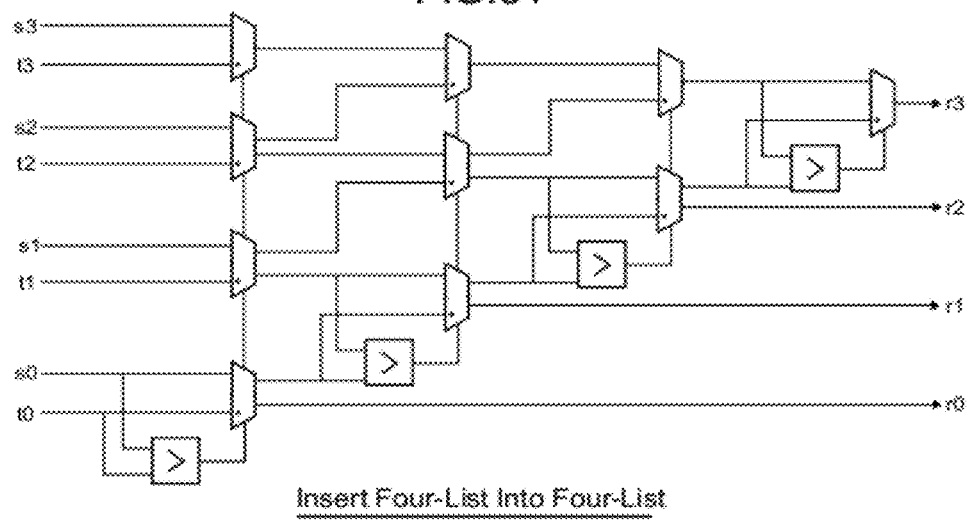
FIG. 52 is a block diagram illustrating a circuit that inserts a sorted four list into another sorted four list according to embodiments of the invention.

FIG. 52 shows how two sorted four-lists (s0, s1, s2, s3) and (t0, t1, t2, t3) can be combined to create a sorted four-list (r0, r1, r2, r3) which contains the four smallest (of the eight) input values.

The operation of FIG. 52 uses the fact that each input four-list is sorted to minimize the number of comparisons. As each comparison is made, the remainder of the each list is twisted so that each comparison is only between the input four-lists, never between two members of the same list. The largest four values are discarded along the way.

Figure 53:
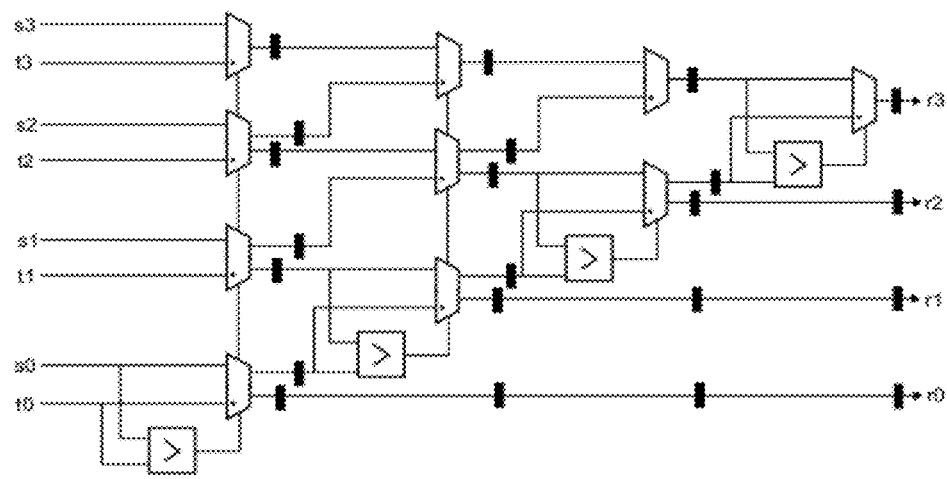
FIG. 53 is a block diagram illustrating a pipelined version of the circuit of FIG. 52.

FIG. 53 shows how the logic of FIG. 52 may be extended into a pipe-line. Since the comparison operation is the longest path, there may be two stages or four stages of pipeline depending on whether two comparisons can be cascaded in a single clock cycle. In FIG. 53 the black registers are always present, and the dark gray registers may not be needed.

Figure 54:
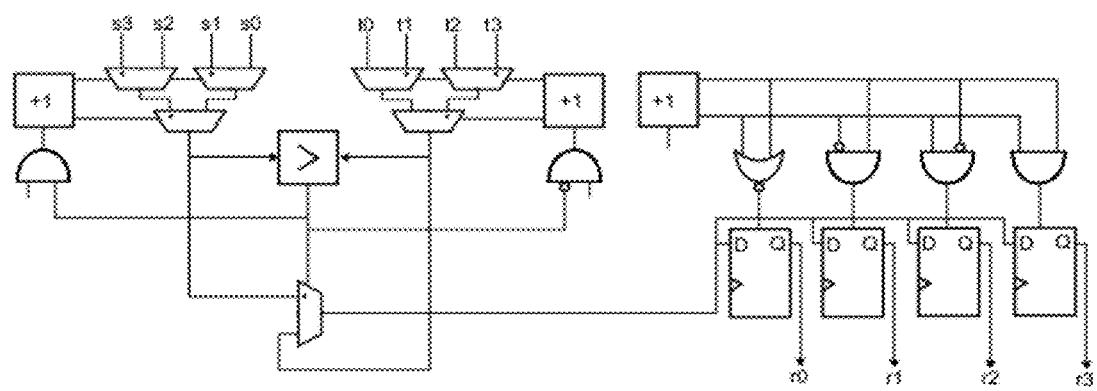
FIG. 54 is a block diagram illustrating a sequential algorithm that combines two sorted four-lists according to embodiments of the invention.

FIG. 54 shows a purely sequential algorithm that combines two sorted four-lists. The operation is simple to understand, simply choose the minimum of the two heads in each input list and pop it from that list. After four clock cycles, reload the input registers. Any details of sequencing the input and the possible use of a FIFO is implementation detail not covered here; FIG. 54 simply shows the essence of a sequential algorithm. Each 2-bit incrementer is made zero on each reload.

Although FIG. 54 is less logic than FIG. 53, the sequential nature makes it difficult to use in combination with other circuits. In general, there needs to be multiple instances of FIG. 54 to make it work in context.

Merging Two Four-Lists

Figure 55:
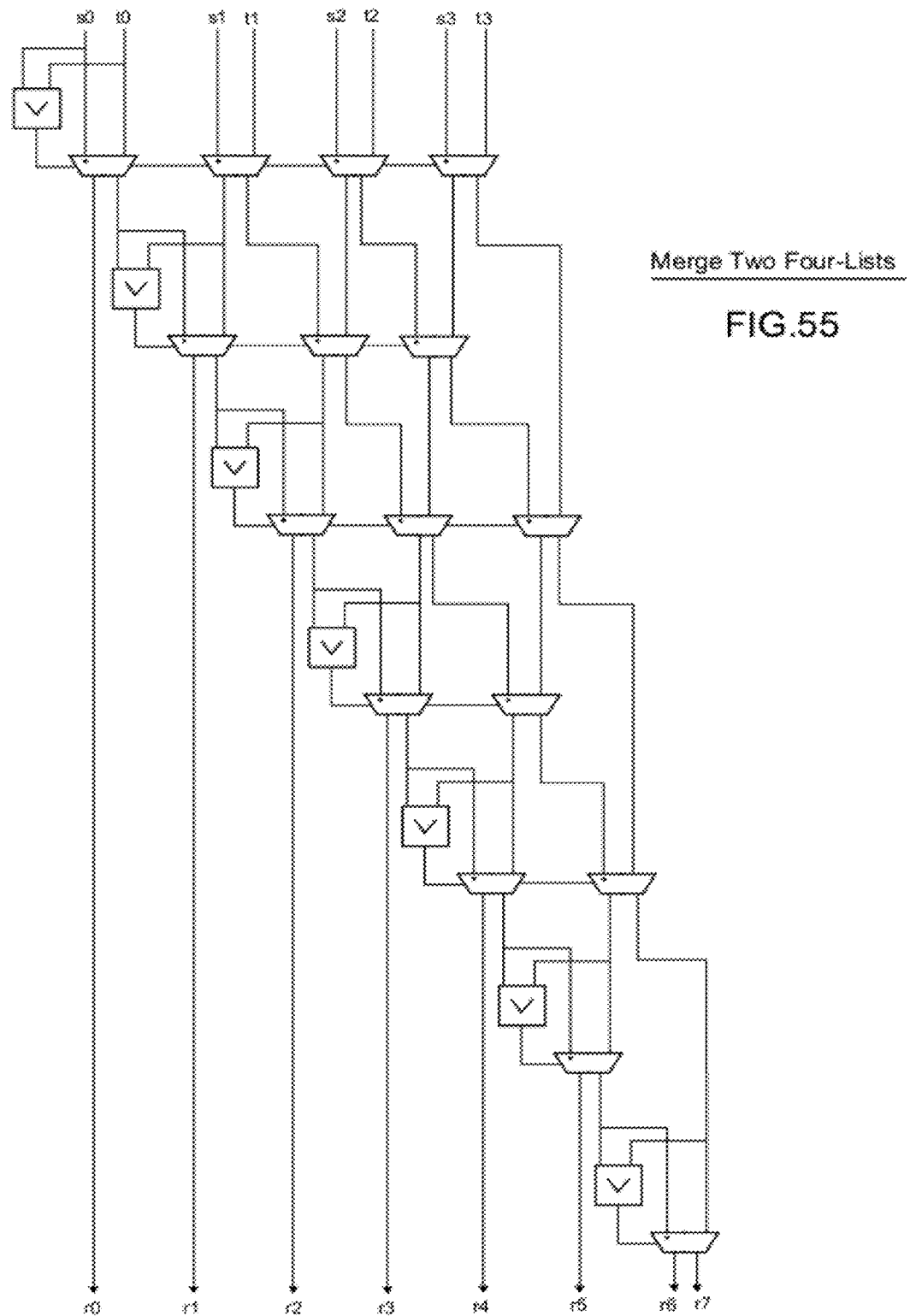
FIG. 55 is a block diagram illustrating a circuit to combine two sorted-four list into on sorted eight-list according to embodiments of the invention.

FIG. 55 shows how two sorted input four-lists (s0, s1, s2, s3) and (t0, t1, t2, t3) can be combined to create a sorted list that is a length of 8. Note that r0 is the minimum value in the sorted output. Clearly, FIG. 55 is based on the logic of FIG. 52, and can be easily pipe-lined in exactly the same way.

Figure 56:
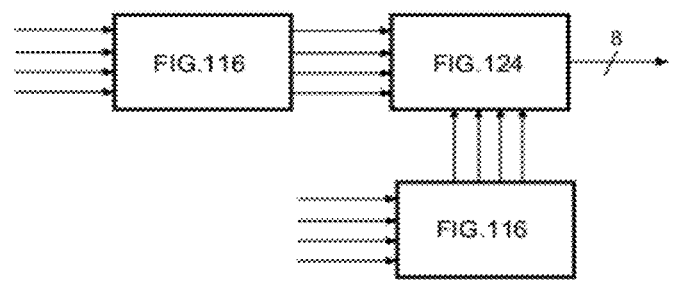
FIG. 56 is a block diagram illustrating a combination of two instances of FIG. 47 and one instance of FIG. 55 to yield a sorted 8-list according to embodiments of the invention.

FIG. 55 can be used in conjunction with two instances of FIG. 47 to create a sorted list of length 8 as shown below in FIG. 56.

16-Way Minimum

The simplest solution for computing the minimum four values of 16 inputs uses the logic of FIG. 50 to insert unsorted values into an initial sorted list. The circuit of FIG. 57 is a fully combinational circuit; however a global minimum list can be taken over multiple groups of 16 inputs cycle by cycle.

Figure 57:
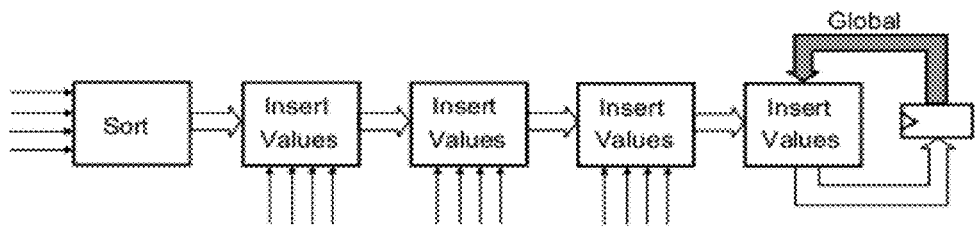
FIG. 57 is a block diagram illustrating a circuit that generates a minimum four of sixteen input values using instances of the circuits illustrated in FIGS. 47, and 50 according to embodiments of the invention.

In FIG. 57, unsorted values are shown by a separate arrow, and a sorted four-list is denoted by a wide arrow. In FIG. 57, the final global minima output is shown shaded.

As an indication of overall size, a circuit that takes 16 minimum values and generates a single minimum value takes 2,120 equivalent NAND gates using a typical Standard Cell Library. FIG. 57 takes 11,322 equivalent NAND gates, a 5.4-fold increase.

If FIG. 57 is made into a pipe-line, the global minima has to be managed more carefully. On the last cycle, the global minima still has 3 previous values in transit. This means that the final input must be presented for another 3 cycles to ensure that all comparisons have been made. In effect, there must a "cooling-off" period at the end to resolve any values still in the pipe-line.

Figure 58:
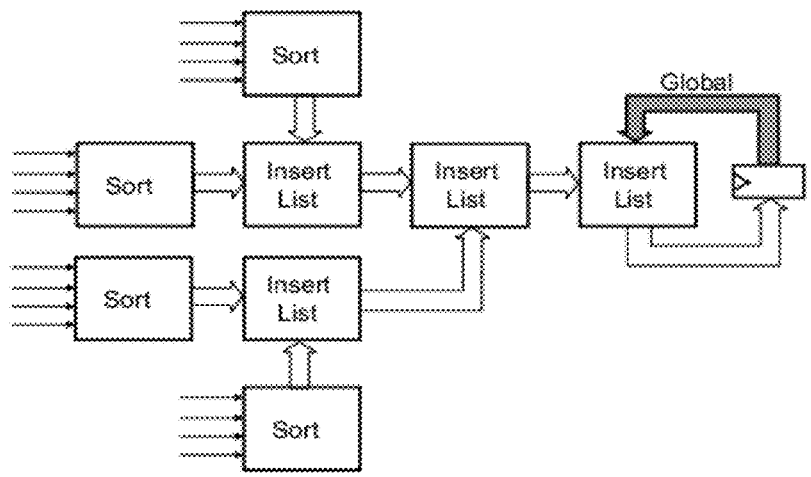
FIG. 58 is a block diagram illustrating a circuit used to pre-sort a single minimum value from sixteen inputs according to embodiments of the invention.

FIG. 58 shows how pre-sorting the lists and using the logic of FIG. 52 to insert sorted four-lists can be used. FIG. 58 uses the same annotation scheme as FIG. 57, and to pipe-line FIG. 58 has exactly the same "cooling-off" process, although the number values still in transit may be less and thus requires a shorter cooling-off.

FIG. 58 takes 7,490 equivalent NAND gates, a factor of 3.5 over computing just a single minimum. If FIG. 58 is adjusted to use two-lists rather than four-lists, 4,140 equivalent NAND gates are used, a factor of 1.95 increase.

Computing more than one minimum is accomplished using sorted lists. Circuits for creating a sorted list of length 2, 4 and 8 have been shown, as well as basic circuits for operating on the lists.

Finally, a hierarchical approach using a pre-sort on the inputs was shown that could compute global minima over many cycles.

The approximate cost for computing N minima compared to producing just a single minimum value has been reduced to a factor of less than N, being 1.9, 3.5 and 5.7 for N=2, 4 and 8 respectively.

Comparing when Equal

So far, the SAD values are compared and a minimum (list) found. If the smallest value appeared more than once, then which became the final value was chosen arbitrarily according to implicit connections. In this section, explicit methods of handling the case when a SAD value is equal is covered. To start, combinational circuits that efficiently compute the less-than function are shown.

Comparing Two Positive Numbers

The basic approach when comparing two positive numbers is to note that any comparison should start with the Most Significant Bits:

If the MSB are not equal, the comparison of the MSB holds for the entire word;

If the MSB are equal, the comparison should use the next less-significant value.

The advantages of this approach is that the comparison can either be greater-than or less-than and as an inherent side-effect, whether the values are equal is also generated. Determining equality may be important for greater-than-or-equal for example, or used as a basis for other decision methods.

Figure 59:
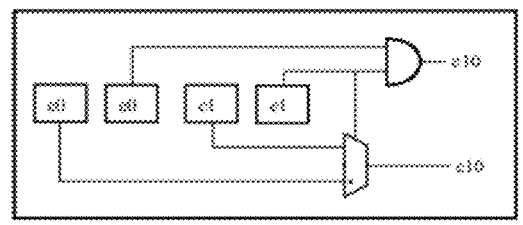
FIG. 59 is a block diagram of a conventional comparison cell.

FIG. 59 shows a 2-bit comparison cell. The block labeled with e performs a single-bit equal; the block labeled with c performs a single-bit comparison, less-than or greater-than. It can easily be shown that FIG. 59 operates correctly:

The 2-bit equals e10 is only true if both bits are equal; and

The 2-bit comparison c10 uses the MSB comparison, c1, only if the MSB are not equal.

Figure 60:
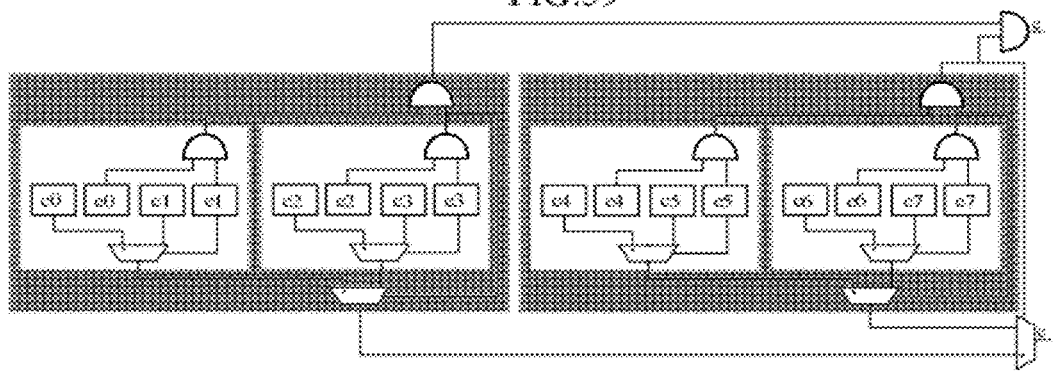
FIG. 60 is a block diagram of multiple cells of FIG. 59 coupled to make an 8-bit comparator used in embodiments of the invention.

The hierarchical nature of FIG. 59 becomes apparent when extending it to more bits, for example FIG. 60 shows an 8-bit comparison function.

The advantages of the hierarchical approach are much clearer in FIG. 60:
  Both a compare, c, and equal, e, output signal are computed;
  The delay for each output is logarithmic with the bit-width of the inputs, that is log 2(width).
Greater Than
The truth table for a 1-bit 'a' greater-than 'b' is shown in the table below:

| Greater than Truth Table | | | |
|---|---|---|---|
| a | b | c | e |
| 0 | 0 | 0 | 1 |
| 0 | 1 | 0 | 0 |
| 1 | 0 | 1 | 0 |
| 1 | 1 | 0 | 1 |

Figure 61:
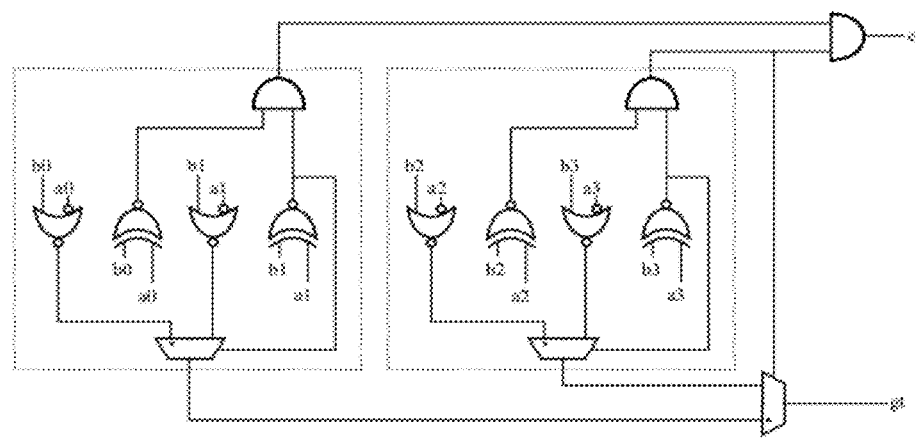
FIG. 61 is a schematic diagram of a 4-bit greater than circuit according to embodiments of the invention.

FIG. 61 shows a 4-bit greater-than circuit.
Less Than
The truth table for a 1-bit 'a' less-than 'b' is shown in the table below:

| Less than Truth Table | | | |
|---|---|---|---|
| a | b | c | e |
| 0 | 0 | 0 | 1 |
| 0 | 1 | 1 | 0 |
| 1 | 0 | 0 | 0 |
| 1 | 1 | 0 | 1 |

Figure 62:
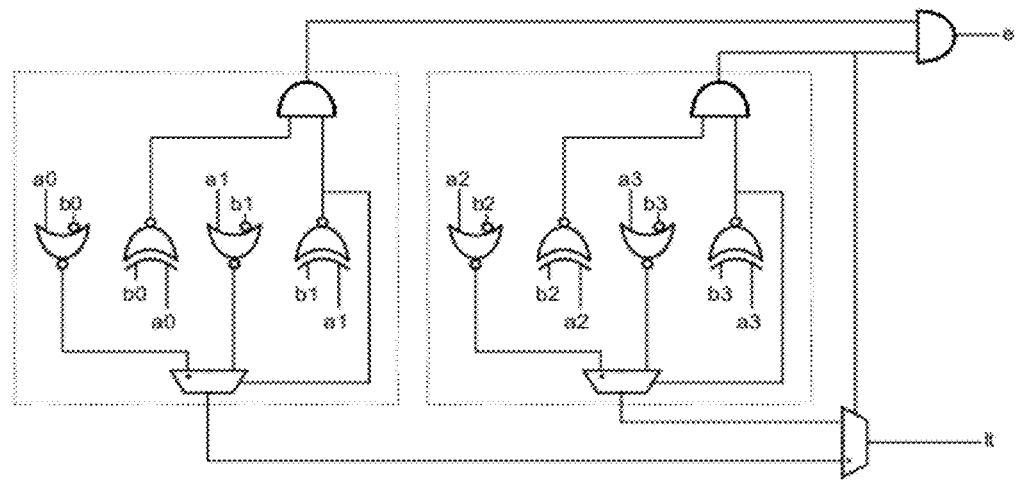
FIG. 62 is a schematic diagram of a 4-bit less than circuit according to embodiments of the invention.

FIG. 62 shows a 4-bit less-than circuit. Note the symmetry and similarity with greater-than shown in FIG. 61.
Greater than or Equal
The truth table for a 1-bit 'a' greater-than-or-equal 'b' is shown in the table below:

| Greater than or equal Truth Table | | | |
|---|---|---|---|
| a | b | c | e |
| 0 | 0 | 1 | 1 |
| 0 | 1 | 0 | 0 |
| 1 | 0 | 1 | 0 |
| 1 | 1 | 1 | 1 |

Since the equal output term is being generated anyway, a final OR-gate can be used as shown in the table below.

| Modified Greater than or equal Truth Table | | | | |
|---|---|---|---|---|
| a | b | c | e | q = c + e |
| 0 | 0 | 0 | 1 | 1 |
| 0 | 1 | 0 | 0 | 0 |
| 1 | 0 | 1 | 0 | 1 |
| 1 | 1 | 1 | 1 | 1 |

Figure 63:
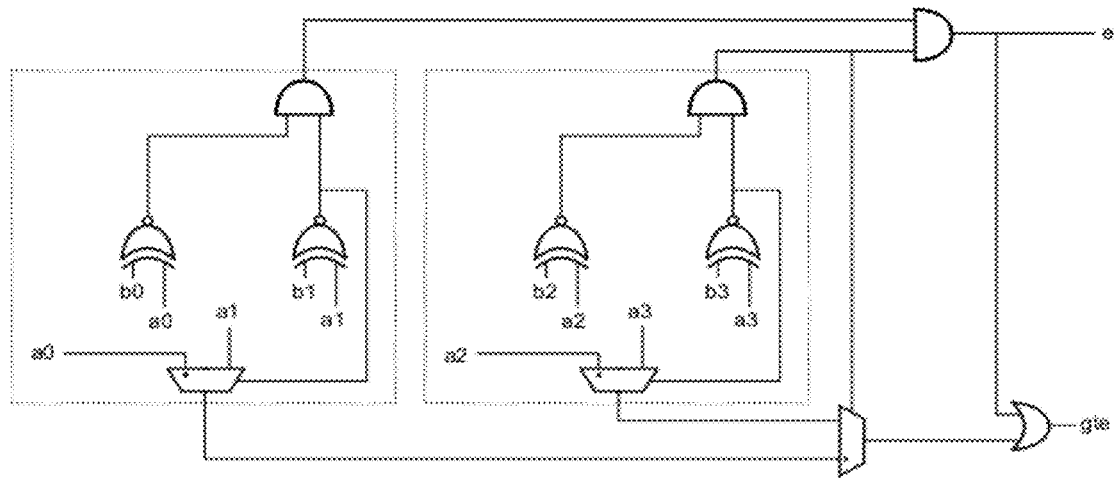
FIG. 63 is a schematic diagram of a 4-bit greater than or equal circuit according to embodiments of the invention.

The underlined terms in the truth table above are arbitrary, since in the final result q they are being OR-ed with a logic one from the "e" value, which is already known. The values in the table are chosen to make the c output one that is easily available, which is simply the "a" input. For example, a 4-bit greater-than-or-equal circuit is shown in FIG. 63
Less than or Equal
The truth table for a 1-bit 'a' less-than-or-equal 'b' is shown in the table below:

| Less than or equal Truth Table | | | |
|---|---|---|---|
| a | b | c | e |
| 0 | 0 | 1 | 1 |
| 0 | 1 | 1 | 0 |
| 1 | 0 | 0 | 0 |
| 1 | 1 | 1 | 1 |

However, since the equal output term is being generated anyway, a final OR-gate can be used as shown in the table below:

| Modified Less than or equal Truth Table | | | | |
|---|---|---|---|---|
| a | b | c | e | q = c + e |
| 0 | 0 | 0 | 1 | 1 |
| 0 | 1 | 1 | 0 | 1 |
| 1 | 0 | 0 | 0 | 0 |
| 1 | 1 | 1 | 1 | 1 |

Figure 64:
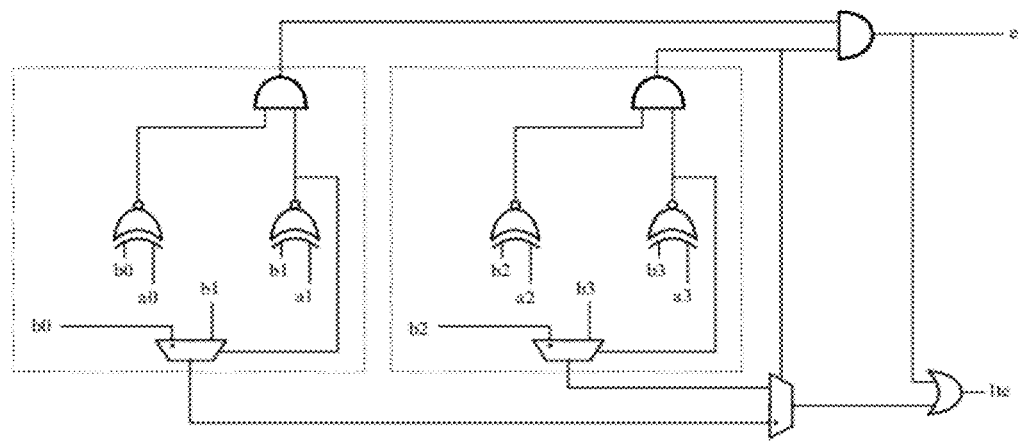
FIG. 64 is a schematic diagram of a 4-bit less than or equal circuit according to embodiments of the invention.
Figure 65:
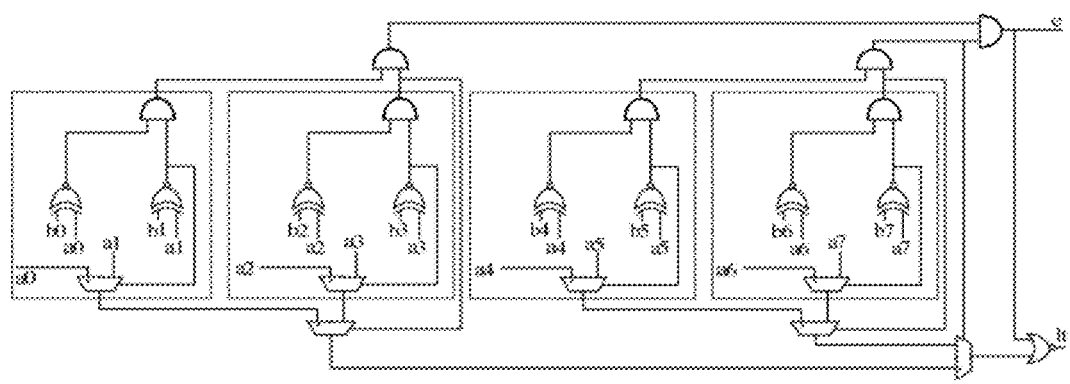
FIG. 65 is a schematic diagram of an 8-bit less than circuit according to embodiments of the invention.
Figure 66:
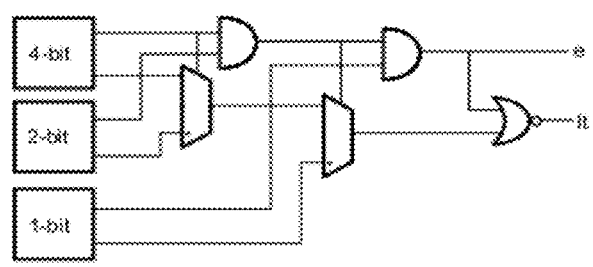
FIG. 66 is a schematic diagram of an 11-bit less than circuit according to embodiments of the invention.
Figure 67:
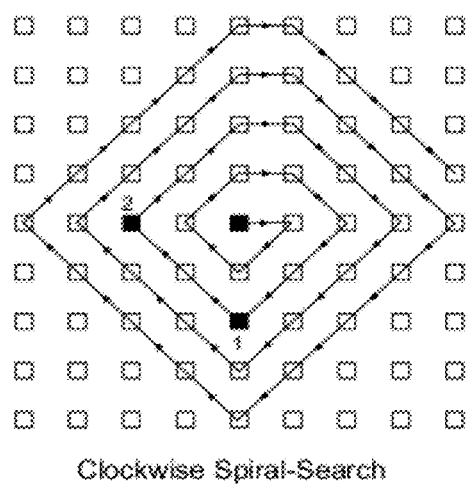
FIG. 67 is a block diagram illustrating a spiral search using integer values according to embodiments of the invention.

The underlined terms in the "c" column arbitrary since in the final result q they are OR-ed with a logic one from the "e" value, which is already known. The values in the table are chosen to make the c output one that is easily available, which is simply the "b" input. For example, a 4-bit less-than-or-equal circuit is shown in FIG. 64.
Smaller Less than
FIG. 65 generates the less-than comparison by noting that less-than is the inverse of greater-than-or-equal. FIG. 65 implements using fewer gates than the 8-bit equivalent of the direct less-than computation of FIG. 62.
Odd Bit-Widths
In the previous examples, all of the bit-widths were a power of two. The hierarchical scheme proposed in this appendix works equally well for non-powers of two. For example, FIG. 66 shows an 11-bit less-than operation, where different powers of two are simply cascaded.
Equal SAD/Rates
When a search compares SAD (or rate) values, there can be times when the smallest rate value(s) are not unique. In this case, there must be some scheme used to determine how a vector is chosen when the rate values are equal.
In many implementations, the decision is arbitrary, and generally depends simply on how the minimum tree is connected and whether the less-than comparison operation is exact. In this appendix, the less-than operation is exact by using a scheme such as a 16-bit version of FIG. 65.
A clockwise spiral search is shown in FIG. 67. The spiral search is a very inconvenient way to order a hardware search, as it uses for an ugly "un-regular" addressing scheme, but does define a very good method to choose amongst equal values. The spiral search is used regularly in software which stops searching when a good match is found, and is known to give good results when choosing amongst several equal values, but up until now there have been no hardware implementations due to the complexities involved.

If FIG. 67 is a search centered around the predicted vector, and by way of example make the two dark gray rates the minimum (with the same rate value), then the sample nearest the center (the (0, 0) difference vector), location is the best choice. For FIG. 67, nearest means the distance when tracing back along the spiral path to the black origin point. For the example, the dark gray position labeled 1 is preferred over position 2.

The Table below shows the first 16 positions in spiral order from the center.

|    | Δx  | Δy  |
| -- | --- | --- |
| 1  | 0   | 0   |
| 2  | 1   | 0   |
| 3  | 0   | -1  |
| 4  | -1  | 0   |
| 5  | 0   | 1   |
| 6  | 1   | 1   |
| 7  | 2   | 0   |
| 8  | 1   | -1  |
| 9  | 0   | -2  |
| 10 | -1  | -1  |
| 11 | -2  | 0   |
| 12 | -1  | 1   |
| 13 | 0   | 2   |
| 14 | 1   | 2   |
| 15 | 2   | 1   |
| 16 | 3   | 0   |

The first pattern of interest is the order of the x-coordinates for the same y-coordinate, that is along a scan line. It can be seen by inspecting FIG. 67 that the pattern (0, 1, −1, 2, −2, 3, −3, . . . ) is the order for any fixed y-displacement. This leads to a simple algorithm for determining distance along the spiral path for any x at the same y displacement, shown in this example code where 'a' and 'b' are the respective x-displacements for the two points being compared:

C-Code To Determine Distance Along Spiral Path—Scan Line Progression

```
//Only along a scan line, and returns true if a<b
static bool compare(const int a, const int b) {
    if (mod(a)==mod(b))
    return a>0;
    return mod(a)<mod(b);//unsigned comparison
}
```

In the general case, examine the basic distance given by Equation 28, since the smallest distance is always closer to the origin.

$$d = |\Delta x| + |\Delta y| \quad \text{Equation (28)}$$

The points that are equidistant using Equation 28 are on a concentric ring. The order for the concentric ring distance=3 is shown in the table below. It can be seen that an explicit order can be derived using a shift of the origin. The c-code for the general comparison routine is shown below the table.

| Δx | Δy | Δy + d | sign(Δx) | Order |
| -- | -- | ------ | -------- | ----- |
| 1  | 2  | 5      | 1        | 5     |
| 2  | 1  | 4      | 1        | 4     |
| 3  | 0  | 3      | 1        | 3     |
| 2  | -1 | 2      | 1        | 2     |
| 1  | -2 | 1      | 1        | 1     |
| 0  | -3 | 0      | 1        | 0     |
| -1 | -2 | 1      | -1       | -1    |
| -2 | -1 | 2      | -1       | -2    |
| -3 | 0  | 3      | -1       | -3    |
| -2 | 1  | 4      | -1       | -4    |
| -1 | 2  | 5      | -1       | -5    |
| 0  | 3  | 6      | 1        | last  |

C-Code to Determine Distance Along Spiral Path—General Case

```
static bool compare(const Point a, const Point b) {
    int d0=mod(a.x)+mod(a.y);
    int d1=mod(b.x)+mod(b.y);
    if (d0==d1) {
        if (a.y==d0) return false;//point a is the last in the ring
        if (b.y==d0) return true;//point b is the last in the ring
        int order0=sign(a.x)*(a.y+d0);
        int order1=sign(b.x)*(b.y+d0);
        return order0>order1;//signed comparison }
    return d0<d1;//unsigned comparison
}
```

It can be seen that the complexity of each of the two compares (scan order and the general case) is quite different, although both are easily computed; the scan-order compare is clearly much simpler.

Local and Global Minima

When a search is comparing rate values for a particular block size, a number of values are presented each cycle. All of the input rate values are compared to create local minima, that is the minima for that cycle. In general a hardware search prefers to search in scan order, and so the local minima are chosen from a set of rate values on the same scan line.

Once the local minima have been selected, they are compared to the current global minima which are then updated. The global minima may have come from any scan line. Thus the two spiral distance comparisons can be used: the simple for local minima and the more complex general case for global minima. Note that there are many local minimum comparisons made for each global minima comparison, which balances the complexity.

For 16 rate values selecting a single minimum, there are 16 comparisons performed for the local minimum and 1 comparison for the global minimum.

For 16 rate values selecting a four-list minimum, there are 32 comparisons performed for the local four-list and 4 comparisons for the global four-list.

Local Minima Comparison

For a local minimum comparison, the routine of comparison along a single scan line, reproduced above, is used. To further reduce the overhead, the x-coordinates are re-coded. To show the behavior, a stride length of 16 values is used, but this is easily extended to any stride length. There are three regions of interest:

1. Stride does not contain the origin and is to the left of the stride containing the origin;
2. Stride does not contain the origin and is to the right of the stride containing the origin;
3. Stride contains the origin.

Figure 68:
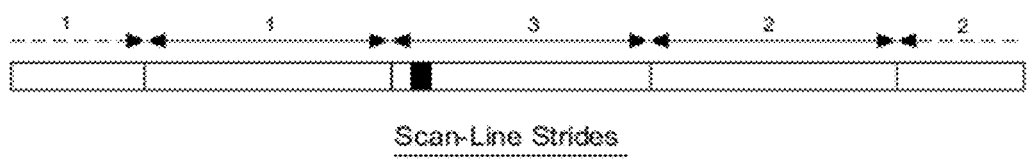
FIG. 68 is a block diagram illustrating concepts in local minima comparisons according to embodiments of the invention.

FIG. 68 shows a scan-line; the origin is shown shaded in black and is the x-coordinate of the predicted vector. The type of each stride is annotated in FIG. 68 to show the pattern.

To re-code the x-coordinates for the example stride length of 16, the following scheme is used:

1. The x-coordinates for the stride are (15, 14, 13, 12, 11, 10, 9, 8, 7, 6, 5, 4, 3, 2, 1, 0);
2. The x-coordinates for the stride are (0, 1, 2, 3, 4, 5, 6, 7, 8, 9, 10, 11, 12, 13, 14, 15);
3. The x-coordinates for the stride are (−L, . . . , 0, . . . , 15−L).

As an example, assume the origin for a stride of type 3 is the 5th pixel in; L=5 and the x-coordinates for the stride are (−5, −4, −3, −2, −1, 0, 1, 2, 3, 4, 5, 6, 7, 8, 9, 10).

The advantage of this re-coding is that each of the re-coded values are limited to a 4-bits.

Figure 69:
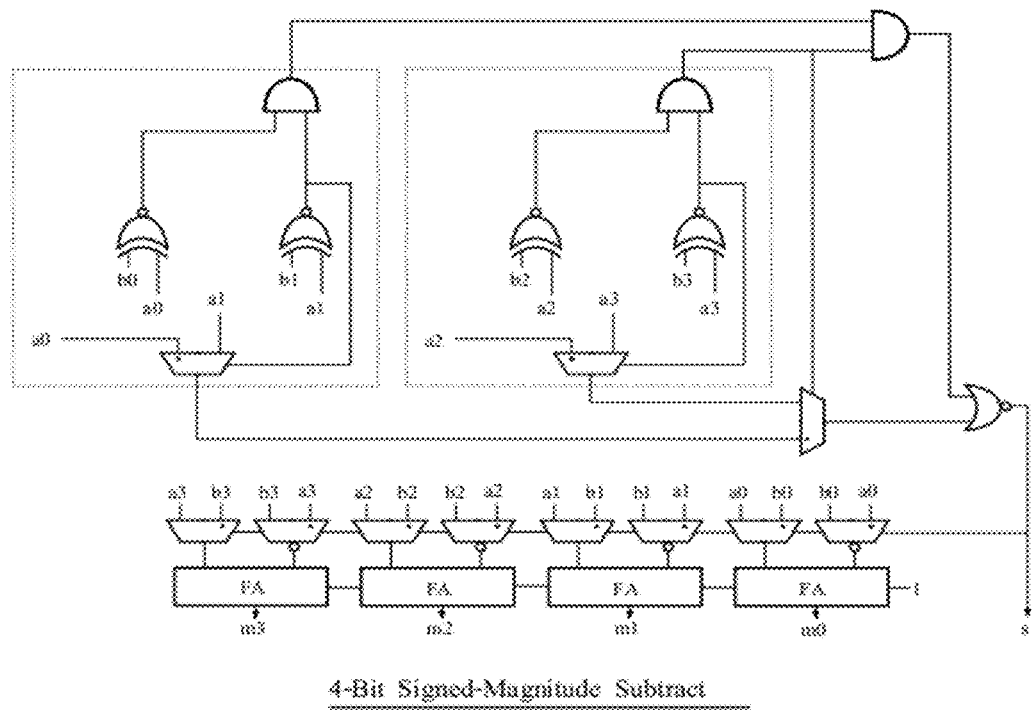
FIG. 69 is a block diagram of a 4-bit signed-magnitude subtraction used in embodiments of the invention.

The circuit of FIG. 69 shows 4-bit signed-magnitude subtraction, a-b. Two 4-bit positive numbers, a and b, are input and a 4-bit magnitude m is output along with a sign-bit s. FIG. 69 is quite small, and takes 60 equivalent NAND gates using a typical Standard Cell Library.

Figure 70:
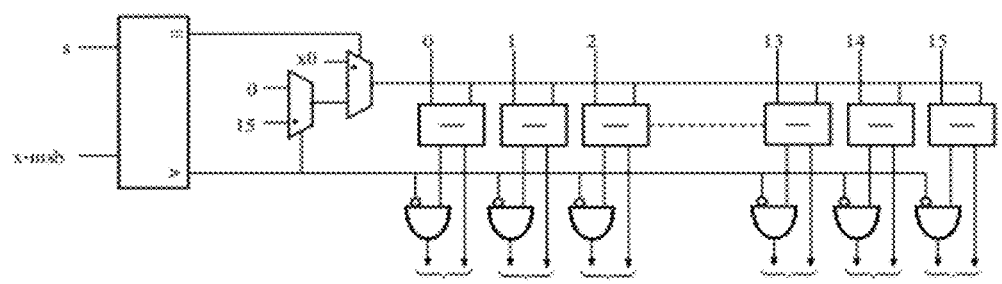
FIG. 70 is a block diagram of a coder using multiple instances of the subtractor illustrated in FIG. 69 according to embodiments of the invention.

In the circuit of FIG. 70, each stride starts at multiples of 16 and the origin is assumed to be at the value x0 which is split into two parts: x−msb and x0. The input x0 is the least-significant 4-bits of the origin, and the input x−msb is the remaining bits. The input s is the stride number. The circuit of FIG. 69 is used 16 times in FIG. 70 to generate the coding. Note that the use of constant values as inputs to the subtract will reduce the actual gates used.

Figure 71:
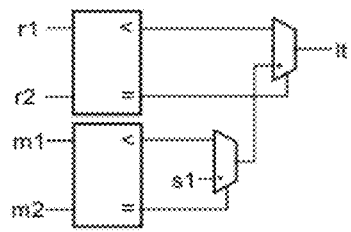
FIG. 71 is a block diagram of a comparator according to embodiments of the invention.

By using a single instance of FIG. 70, the comparison logic for the local minima is made simple. In FIG. 71 two rate values r1 and r2 are input with x-coordinates {s1, m1} and {s2, m2} respectively. When the rate values are equal, FIG. 71 uses the algorithm of the scan-line progression C-Code reproduced above. A main feature of FIG. 71 is that the comparison of m1 and m2 is only 4-bits wide.

Global Minima Comparison

When comparing global minima, the position of each point can be from any pixel in the picture and so the algorithm of the general-case spiral determination C-code reproduced above must be used.

Figure 72:
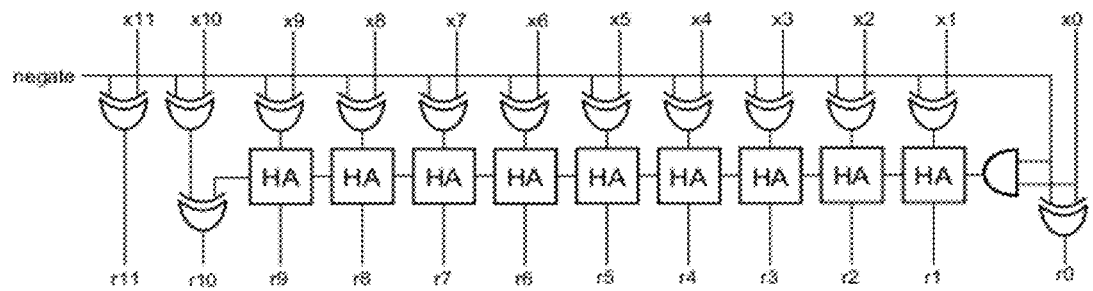
FIG. 72 is a block diagram of a multiplier used by embodiments of the invention.

FIG. 72 shows one of the building blocks required for the algorithm. FIG. 72 is a circuit that multiplies a 12-bit two's-complement number by 1 or −1 on control of the input negate. The allowed input range is between −2047 and 2047.

Figure 73:
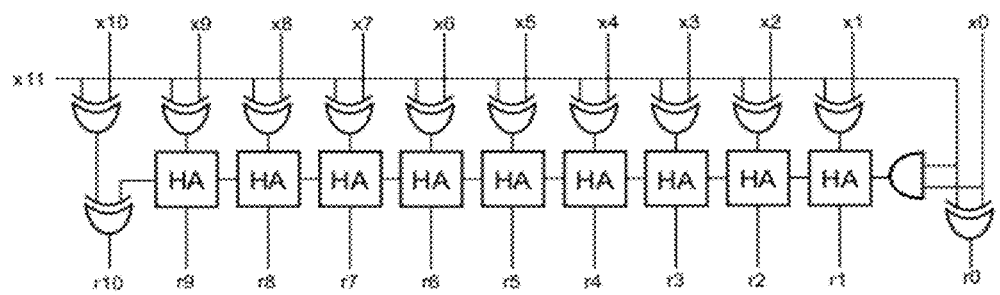
FIG. 73 is a block diagram of modulus circuit used by embodiments of the invention.

In a similar vein, FIG. 73 is a circuit that takes the modulus of a 12-bit two's-complement number. The allowed input range is between −2047 and 2047, and the output is between 0 and 2047.

Figure 74:
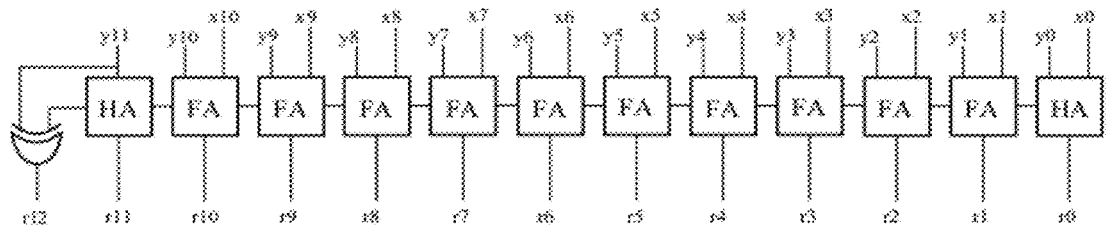
FIG. 74 is a block diagram of an adder circuit used by embodiments of the invention.

FIG. 74 takes an unsigned 11-bit number and adds it to a two's-complement signed 12-bit number to generate a 13-bit signed result.

Figure 75:
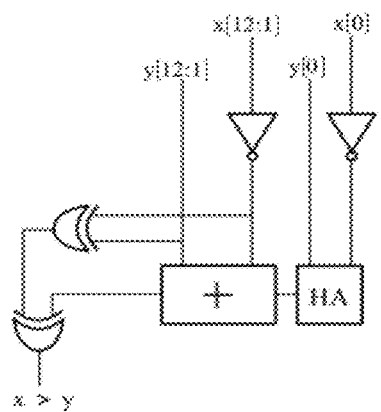
FIG. 75 is a block diagram of a signed comparison circuit used in embodiments of the invention.

To compare two 13-bit signed numbers, subtract them as shown in FIG. 75. Note that the input must be correctly sign-extended to operate correctly as shown in FIG. 75. Since the comparison operation only requires using the sign-bit of the subtraction, the sum terms in FIG. 75 are not required, and any full adders, FA, or any half adders, HA, can be replaced with just the carry logic.

Figure 76:
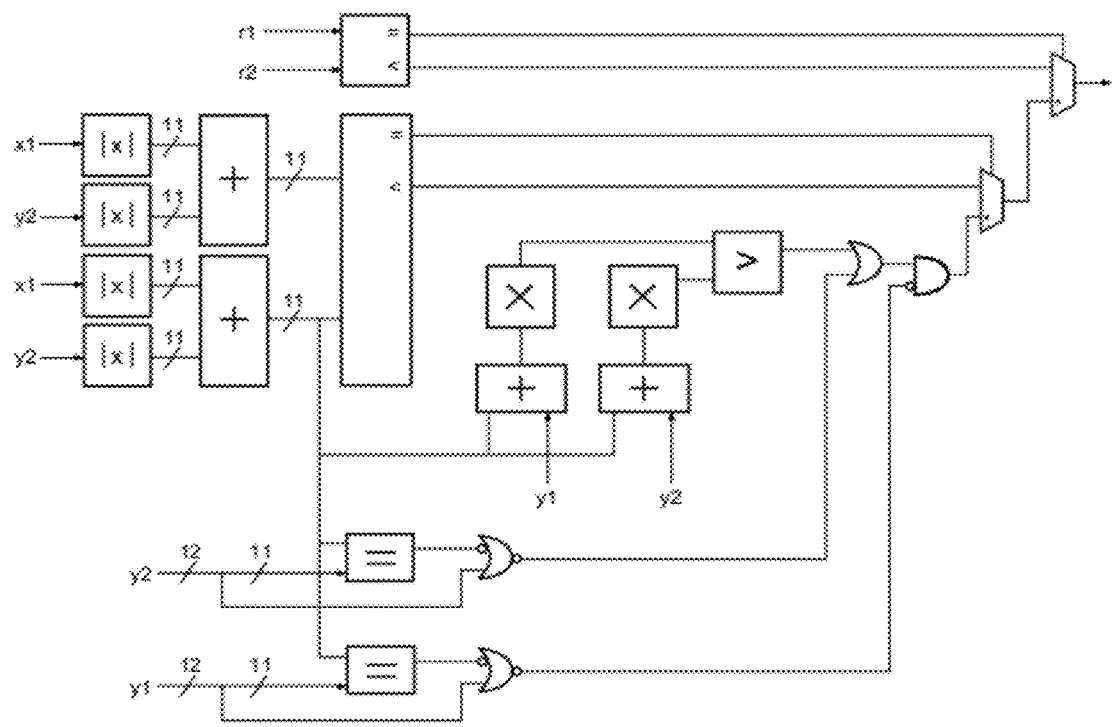
FIG. 76 is a block diagram of a minima comparison circuit according to embodiments of the invention.

FIG. 76 takes two 16-bit rate values, r1 and r2, and associated with each respectively is a 12-bit difference vector (x1, y1) and (x2, y2), where all of the components are signed values. The difference vector is the position of the vector with respect to the predicted vector. When the rate values are equal, the algorithm of FIG. 76 is used.

When examining the algorithm of FIG. 76, each of the variables has the following range:

| Variable | min | max | Variable | min | max |
|---|---|---|---|---|---|
| a.x | −2047 | 2047 | d0 | 0 | 2047 |
| a.y | −2047 | 2047 | d1 | 0 | 2047 |
| b.x | −2047 | 2047 | order0 | −4094 | 4094 |
| b.y | −2047 | 2047 | order1 | −4094 | 4094 |

Systems

The various concepts, components, and sub-components described above can be assembled into various systems that perform a multitude of different useful processes.

In one system a comparison measure of two datasets is generated. Instead of generating an absolute value difference of each individual set of related components in the datasets, then summing those differences, as is one of the current well-known processes to make such a comparison measure, embodiments of the invention include a system that uses a much different process. Initially, each of the two datasets is summed independently, and without regard to direction (sign). Significantly, these totals may be pre-computed (and are constants across many comparison) before any comparison between the two sets is made. At a later time, each common location value in the dataset is evaluated to determine the set of minimum values, each of which are summed to make an interim subtotal. An amount equal to twice the subtotal is then subtracted from the previously calculated totals to generate the final comparison measure.

In another system, a different comparison value is computed, which is a total summation value rather than a sum of differences. The total summation value can be directly used to create the SAD value for interpolated positions without having to perform the interpolation. In this embodiment, while generating a SAD value, the system also generates a set of intermediate values with no overhead. The intermediate values can then be summed by neighbors to create an intermediate total, which is identical to a SAD value interpolated to the position of the neighbor. Neighbors can use intermediate values from adjacent neighbors, in which the interpolation is a ½ step, or from neighbors equidistant which creates a ½ step at a different resolution. The intermediate values are computed from a) known position values; b) values interpolated from the known position values; or c) values directly from neighbor values. The formulas for the intermediate total are given above.

In a related system, each hierarchical "level" of values for the intermediate total is created as desired and each level can be used to generate sub-level values, or interpolated values. For example a first level may include generating h-pel values from given or calculated i-pel values. Included in the first level is the possibility of generating h-pel values from h-pel values too. Then, a further sub-level of q-pel values can be generated from either the h-pel values, or even directly from the i-pel values. To generate another sub-level, additional intermediate values are calculated from values in nearby levels. These iterations can continue infinitely.

In one aspect, the sum of a pair of intermediate values can be thought of as a Sum of Absolute Differences of bi-linear interpolated (i.e., filtered) values from the starting points of the intermediate values.

Intermediate totals can be generated from any pair of intermediate values, although it is most likely that the most local of the values will be the most desirable to generate each intermediate total.

When designing a system using these embodiments, more hardware capacity directly translates to increased performance. For example, a larger search area can be searched for a given hardware capacity. Another example is that the repeating, recursive nature of the bi-linear interpolation allows the hardware to be re-used to generate a further set of sub-level values. For instance, from the known integer values, h-pel and q-pel values can be generated, as described above. If that is the extent of the available hardware, the q-pel values can then be substituted as the "new i-pel" values, and process repeated to generate ⅛ and 1/16-pel values. A further substitution of the 1/16 pels as "new i-pel" values allows the same hardware to then generate 1/32 and 1/64-pel values, all from the original set of original i-pel values and simple repetition.

A new circuit can be created as described above that generates both a SAD value and a set of Intermediate Total values, simultaneously, based on a comparison of two values, then outputs both for further processing. A related circuit adds Intermediate Total values to generate both a SAD value (interpolated) and a set of Intermediate Total values. The similarity of the two circuits gives an infinite recursion of interpolation, and a simple input multiplexer can change the same embodiment from one circuit to another for maximum flexibility.

Another new system according to embodiments of the invention involves compression whereby an n-bit multi-bit value can be stored and operated on in less than n bits. In one embodiment, if the multi-bit value is less than a threshold, then the multi-bit value is stored in the reduced-bit storage directly, with no loss of precision. If the multi-bit value is greater than the threshold, then the Least Significant Bits (LSBs) of the multi-bit value are shifted into the reduced-bit storage, and a compression flag set. To decompress, if the compression flag was not set, the bits stored in the LSBs of the reduced-bit storage are merely copied back into the multi-bit value directly. If the compression flag was set, then the bits stored in the LSBs of the reduced-bit storage are shifted (left) by the same amount they were shifted (right) during compression, and an error-minimizing value is added to the LSBs of the multi-bit value. The error minimizing value may be ½ the threshold value, or another number. The compression method when used for computing SAD is biased towards making good matches: if the match is good the SAD is exact; if any of the difference values is not a good match, the compressed value makes the final SAD larger. This provides a filtering effect by rejecting large difference spike values of a set in preference for a set of variations with no spike(s).

In one embodiment the multi-bit value is 8 bits, the reduced-bit storage is 4 bits, the threshold is 16, and the error minimizing value is 8. Such a compression system provides accuracy when needed, such as determining a minimum of several relatively similar low numbers, and is less accurate when the minimum value is very high.

Another embodiment of the invention provides for a built-in masking function used in conjunction with either the SAD engine or the Intermediate Total engine described above. In this embodiment a controllable mask bit is set for each individual $a_i$:$b_i$ comparison. To include the particular location represented by the "i" value in the comparison, the mask bit is left unset; to ignore any location, the mask bit is set. If the mask bit is set, the comparison value is calculated as zero, i.e., there is no difference entered into the calculation, even if there is an actual difference in the two datasets. Masking allows a particular non-rectangular shape or feature to be detected or highlighted compared to regular processing.

Other embodiments of the invention are directed to manipulating numbers and values. For instance, using embodiments described above, unsorted values may be inserted into a sorted list using a minimum of hardware resources.

Other embodiments of the invention are directed to systems and methods of providing multiple values to an encoder. Compared to prior art and present day systems, which only pass a single minimum value or minimum vector, rate distorted or not, to an encoder, embodiments of the invention can work with the encoder to provide an intelligent encoder multiple value candidates to make a final encoding decision.

Whereas in currently processed video there are three different predicted vectors, one each for inter-coding, intra-coding, and skip, embodiments of the invention can provide multiple input predicted vectors, which allows the encoder much greater latitude in predicting the best encoding method. This solves a problem of inaccurate predicted vectors for which a typical motion estimation system has made assumptions that turn out to be inaccurate for a particular situation. Thus, SAD or rate calculations, as is the current state of the art, may not be good enough to allow an encoder to best encode a data stream. Providing the encoder with supplemental, efficiently calculable information, such as multiple minima and multiple predicted rate-compensated vectors, and optionally including a predicted or calculated bit-cost of each value transmitted, allows the encoder to increase its encoding efficiency.

The use of multiple predicted vectors can be efficiently generated from a small-footprint hardware cost. In typical, real-world video there are different predicted vectors dependent on how the preceding block was predicted, and embodiments of the invention can either generate estimated predicted vectors or use each of the provided vectors in calculating final values to pass to the encoder. One way to rank multiple equal values is to use a spiral test—whichever of the lowest equal values is first to appear in a spiral search is the selected value, as is described in detail above.

Although particular component blocks, sub-components, circuits, and systems to implement a variety of image processing have been described above, it is not intended that such specific references be considered as limitations upon the scope of this invention except in-so-far as set forth in the following claims.

What is claimed is:

1. In a video search processor, a method of coding a match value into a limited number of bits and decoding the coded match value, the method comprising coding the match value by:
   when a number representing the match value is less than a threshold limit number capable of being represented in the limited number of bits, storing the number into the limited number of bits without change,
   when the number is greater than or equal to the threshold limit number capable of being represented in the limited number of bits, storing only the most significant bits in the limited number of bits and setting a compression flag; and
   decoding the stored match value by:
      when the compression flag is not set, retrieving the stored number, and
      when the compression flag is set, generating an output by:
         multiplying the stored most significant bits by an amount equal to the least significant bit stored to generate an estimate; and
         adding a constant to the estimate.

2. The method of claim 1 in which after decoding the stored number when the compression flag is set, the decoded value is always greater than the original match value.

3. The method of claim 1, further comprising summing the compressed values over an array of video samples and decoding the summed totals.

4. The method of claim 3, further comprising comparing the compressed and summed values over a plurality of video sample arrays.

5. The method of claim 4 in which a smallest value of the comparison does not contain any differences larger than a threshold value.

6. A processor structured to dynamically compress and de-compress binary numbers, the processor comprising a compressor including:
- an input structured to receive x number of bits in an input value,
- a comparator structured to determine if the input value is greater than a threshold,
- a storage section structured to:
  - store the input value in fewer than x number of bits when the input value is less than the threshold,
  - store the most significant bits of the input value in the fewer than x number of bits when the input value is greater than the threshold, and
  - set a compression flag; and
- the processor further comprising a de-compressor including
  - a detector structured to determine a state of the compression flag, and
  - a retrieval section structured to:
    - when the compression flag is not set, retrieve the stored number, and
    - when the compression flag is set, generate an output by:
      - multiplying the stored most significant bits by an amount equal to the least significant bit stored to generate an estimate, and
      - adding a constant to the estimate.

7. The processor of claim 6, further comprising:
- a summing portion structured to sum a series of compressed values related to an array of video samples.

8. The processor of claim 7 further structured to compare compressed and summed values over a plurality of video sample arrays.

9. The processor of claim 8 in which a smallest value of the comparison does not contain any differences larger than a value of the threshold.

* * * * *